US009685233B2

United States Patent
Hsieh et al.

(10) Patent No.: US 9,685,233 B2
(45) Date of Patent: Jun. 20, 2017

(54) PROGRAMMING MULTIBIT MEMORY CELLS

(71) Applicant: MACRONIX INTERNATIONAL CO., LTD., Hsinchu (TW)

(72) Inventors: Chih-Chang Hsieh, Hsinchu (TW); Ti-Wen Chen, Tainan (TW); Yung Chun Li, New Taipei (TW); Kuo-Pin Chang, Miaoli (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/153,934

(22) Filed: Jan. 13, 2014

(65) Prior Publication Data

US 2014/0198570 A1 Jul. 17, 2014

Related U.S. Application Data

(60) Provisional application No. 61/752,985, filed on Jan. 16, 2013.

(51) Int. Cl.
*G11C 16/10* (2006.01)
*G11C 11/56* (2006.01)
(Continued)

(52) U.S. Cl.
CPC .......... *G11C 16/10* (2013.01); *G11C 11/5628* (2013.01); *G11C 16/3459* (2013.01);
(Continued)

(58) Field of Classification Search
CPC ............ G11C 16/0483; G11C 11/5628; G11C 16/3454; G11C 2211/5621;
(Continued)

(56) References Cited

U.S. PATENT DOCUMENTS 7,177,199 B2 * 2/2007 Chen et al. .............. 365/185.28
7,433,241 B2 * 10/2008 Dong et al. .............. 365/185.25
(Continued)

OTHER PUBLICATIONS

Hsieh, Chih-Chang, et al, :Study of the interference and disturb mechanisms of split-page 3D vertical gate (VG) NAND flash and optimized programming algorithms for multi-level cell (MLC) storage, 2013 Symposium on VLSI Technology (VLSIT), pp. T156,T157, Jun. 11-13, 2013.
(Continued)

*Primary Examiner* — Hoai V Ho
*Assistant Examiner* — Roberto Mancera
(74) *Attorney, Agent, or Firm* — Yiding Wu; Haynes Beffel & Wolfeld LLP

(57) ABSTRACT

A multiple bits per cell memory is operated by applying a one-pass, multiple-level programming, using a single pulse sequence one time (or in one-pass), such as an incremental pulse program sequence, with program verify steps for multiple target program levels, to program multiple bits per cell in a plurality of memory cells. Using these techniques, the number of program pulses required, and the time required for programming the data can be reduced. As a result, an improvement in programming throughput and a reduction in disturbance conditions are achieved. Variants of the one-pass, multiple-level programming operation can be adopted for a variety of memory cell types, memory architectures, programming speeds, and data storage densities.

17 Claims, 23 Drawing Sheets

(51) Int. Cl.
  *G11C 16/34* (2006.01)
  *G11C 16/04* (2006.01)
  *H01L 27/11551* (2017.01)
  *H01L 27/11578* (2017.01)

(52) U.S. Cl.
  CPC .. *G11C 16/0483* (2013.01); *G11C 2211/5621* (2013.01); *G11C 2216/14* (2013.01); *H01L 27/11551* (2013.01); *H01L 27/11578* (2013.01)

(58) Field of Classification Search
  CPC ............ G11C 16/3459; G11C 16/3418; G11C 16/3427; G11C 2211/5648; G11C 2216/14; G11C 16/34; G11C 11/5621; G11C 2211/5646; G11C 2211/5641; G11C 8/12
  See application file for complete search history.

(56) References Cited

U.S. PATENT DOCUMENTS

| | | | | |
|---|---|---|---|---|
| 7,440,322 | B2* | 10/2008 | Kamei | 365/185.17 |
| 7,450,430 | B2* | 11/2008 | Hemink et al. | 365/185.25 |
| 7,457,166 | B2* | 11/2008 | Hemink et al. | 365/185.29 |
| 7,463,531 | B2* | 12/2008 | Hemink et al. | 365/185.25 |
| 7,468,918 | B2* | 12/2008 | Dong et al. | 365/185.25 |
| 7,508,721 | B2* | 3/2009 | Li | G11C 16/3468 365/185.01 |
| 7,522,457 | B2* | 4/2009 | Hemink et al. | 365/185.29 |
| 7,701,775 | B2* | 4/2010 | Kang | G11C 11/5628 365/185.03 |
| 7,773,429 | B2* | 8/2010 | Jeon et al. | 365/185.28 |
| 8,026,544 | B2* | 9/2011 | Ito et al. | 257/321 |
| 8,194,461 | B2* | 6/2012 | Kosaki | G11C 11/5628 365/185.02 |
| 8,274,838 | B2* | 9/2012 | Dutta | G11C 11/5628 365/185.03 |
| 8,278,170 | B2* | 10/2012 | Lee | H01L 27/11551 257/E21.645 |
| 8,385,120 | B2* | 2/2013 | Jang | G11C 16/3418 365/185.12 |
| 8,441,858 | B2* | 5/2013 | Sarin | G11C 16/0483 365/185.17 |
| 8,441,859 | B2* | 5/2013 | Kim | G11C 16/10 365/185.03 |
| 8,472,245 | B2* | 6/2013 | Kim | G11C 16/0483 365/185.03 |
| 8,514,621 | B2* | 8/2013 | Choi | G11C 11/5628 365/185.03 |
| 8,588,003 | B1* | 11/2013 | Weingarten | G11C 11/5628 365/185.02 |
| 8,605,507 | B2* | 12/2013 | Liu | G11C 16/10 365/185.17 |
| 8,630,118 | B2* | 1/2014 | Sakai | G11C 29/025 365/185.17 |
| 8,638,608 | B2* | 1/2014 | Lai et al. | 365/185.17 |
| 8,958,249 | B2* | 2/2015 | Dutta et al. | 365/185.17 |
| 8,982,626 | B2* | 3/2015 | Dong et al. | 365/185.17 |
| 8,982,637 | B1* | 3/2015 | Dong et al. | 365/185.21 |
| 2004/0174748 | A1* | 9/2004 | Lutze et al. | 365/185.28 |
| 2005/0219896 | A1* | 10/2005 | Chen et al. | 365/185.03 |
| 2005/0248988 | A1* | 11/2005 | Guterman et al. | 365/185.28 |
| 2005/0248989 | A1* | 11/2005 | Guterman et al. | 365/185.28 |
| 2005/0276108 | A1* | 12/2005 | Guterman | 365/185.28 |
| 2006/0120165 | A1* | 6/2006 | Hemink | 365/185.28 |
| 2006/0221709 | A1* | 10/2006 | Hemink et al. | 365/185.29 |
| 2006/0279990 | A1* | 12/2006 | Wan et al. | 365/185.17 |
| 2007/0153594 | A1* | 7/2007 | Chen | G11C 11/5628 365/195 |
| 2008/0013360 | A1* | 1/2008 | Hemink et al. | 365/100 |
| 2008/0019164 | A1* | 1/2008 | Hemink et al. | 365/100 |
| 2008/0084751 | A1* | 4/2008 | Li et al. | 365/185.19 |
| 2008/0084752 | A1* | 4/2008 | Li et al. | 365/185.19 |
| 2008/0089133 | A1* | 4/2008 | Ito | 365/185.22 |
| 2008/0101126 | A1* | 5/2008 | Hemink et al. | 365/185.19 |
| 2008/0117683 | A1* | 5/2008 | Hemink | 365/185.19 |
| 2008/0117684 | A1* | 5/2008 | Hemink | 365/185.19 |
| 2008/0123436 | A1* | 5/2008 | Byeon | 365/185.29 |
| 2008/0266978 | A1* | 10/2008 | Goda | 365/185.26 |
| 2009/0003054 | A1* | 1/2009 | Hung | G11C 11/5671 365/185.03 |
| 2009/0010064 | A1 | 1/2009 | Nazarian | |
| 2009/0027959 | A1* | 1/2009 | Lee | 365/185.03 |
| 2010/0014349 | A1* | 1/2010 | Mokhlesi | 365/185.03 |
| 2010/0074025 | A1* | 3/2010 | Park et al. | 365/185.19 |
| 2010/0097863 | A1* | 4/2010 | Kim | G11C 11/5628 365/185.18 |
| 2010/0128523 | A1* | 5/2010 | Yip | G11C 11/5628 365/185.03 |
| 2010/0321998 | A1* | 12/2010 | Jang | 365/185.03 |
| 2011/0058424 | A1* | 3/2011 | Goda | G11C 11/5628 365/185.19 |
| 2011/0134702 | A1* | 6/2011 | Imondi et al. | 365/185.19 |
| 2011/0182121 | A1* | 7/2011 | Dutta | G11C 11/5628 365/185.09 |
| 2011/0292724 | A1* | 12/2011 | Kim | 365/185.03 |
| 2012/0092931 | A1* | 4/2012 | Edahiro | G11C 16/3459 365/185.17 |
| 2012/0163080 | A1 | 6/2012 | Shalvi et al. | |
| 2012/0182806 | A1 | 7/2012 | Chen et al. | |
| 2012/0246395 | A1* | 9/2012 | Cho | G06F 12/0246 711/103 |
| 2013/0301352 | A1* | 11/2013 | Shim et al. | 365/185.03 |
| 2014/0269057 | A1* | 9/2014 | Shereshevski | G11C 16/10 365/185.03 |
| 2014/0362641 | A1* | 12/2014 | Dong et al. | 365/185.17 |
| 2015/0339057 | A1* | 11/2015 | Choi | G06F 3/061 711/103 |

OTHER PUBLICATIONS

Johnson, Mark, et al., "512-Mb PROM With a Three-Dimensional Array of Diode/Antifuse Memory Cells," IEEE J. of Solid-State Circuits, vol. 38, No. 11, Nov. 2003, 1920-1928.

Jung, Soon-Moon, et al, "Three Dimensionally Stacked NAND Flash Memory Technology Using Stacking Single Crystal Si Layers on ILD and TANOS Structure for Beyond 30nm Node," International Electron Devices Meeting, 2006. IEDM '06, Dec. 11-13, 2006, pp. 1-4.

Lai, Erh-Kun et al., "A Multi-Layer Stackable Thin-Film Transistor (TFT) NAND-Type Flash Memory," International Electron Devices Meeting, 2006. IEDM '06, Dec. 11-13, 2006, pp. 1-4.

Suh et al., "A 3.3 V 32 Mb NAND Flash Memory with Incremental Step Pulse Programming Scheme," Solid-State Circuits Conference, 1995. Digest of Technical Papers. 41st ISSCC, Feb. 15-17, 1995 IEEE International, pp. 128-129 and 350.

Tanaka H., et al., "Bit Cost Scalable Technology with Punch and Plug Process for Ultra High Density Flash Memory," 2007 Symp. VLSI Tech., Digest of Tech. Papers, pp. 14-15.

U.S. Appl. No. 13/827,475 entitled "Programming Technique for Reducing Program Disturb in Stacked Memory Structures," filed Mar. 14, 2013, 47 pages.

* cited by examiner

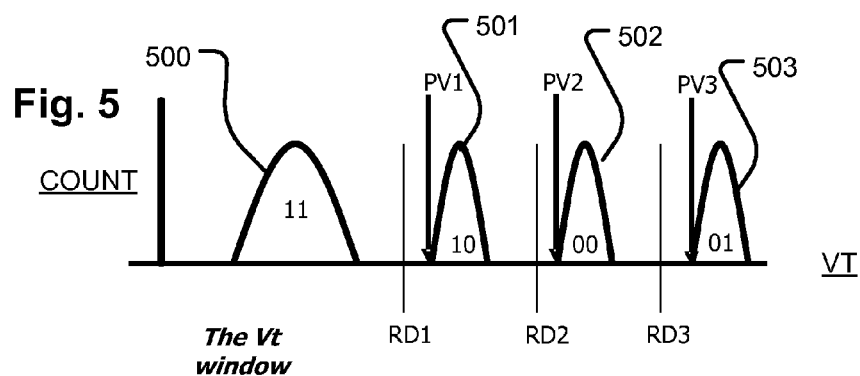
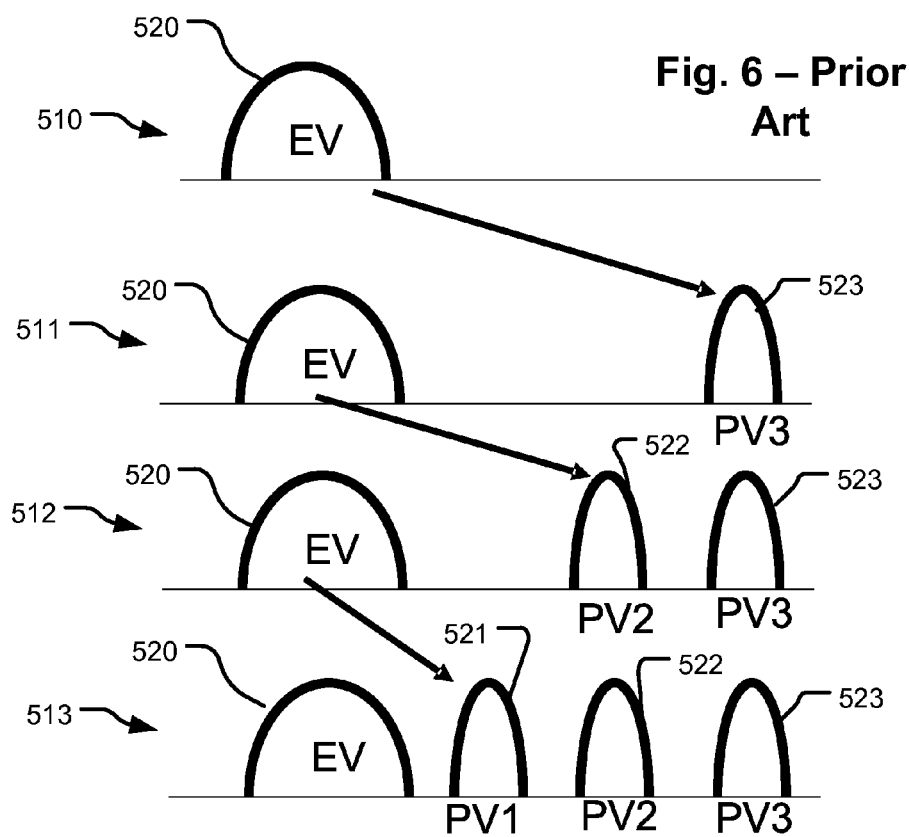

| Data-in | 11 | 10 | 00 | 01 |
|---------|----|----|----|----|
| PV1 | 1 | 0 | 1 | 1 |
| PV2 | 1 | 1 | 0 | 1 |
| PV3 | 1 | 1 | 1 | 0 |

| Traditional MLC operation | MLC level | ISPP Voltage | ISPP Step | Program shots |
|---|---|---|---|---|
| | PV1 | start Va end Va' | Step=△V | $\frac{Va'-Va}{\Delta V}+1$ |
| | PV2 | start Vb end Vb' | Step= △V | $\frac{Vb'-Vb}{\Delta V}+1$ |
| | PV3 | start Vc end Vc' | Step= △V | $\frac{Vc'-Vc}{\Delta V}+1$ |
| One pass, Multilevel | PV1, PV2, PV3 | start Va end Vc' | Step= △V | $\frac{Vc'-Va}{\Delta V}+1$ |

| program bias | PV1 | PV2 | PV3 |
|---|---|---|---|
| Va | V | | |
| Va+ΔV | V | V | |
| Va+2*ΔV | V | V | V |
| Va+3*ΔV | V | V | V |
| Va+4*ΔV | V | V | V |
| Va+5*ΔV | V | V | V |
| Va+6*ΔV | V | V | V |
| Va+7*ΔV | | V | V |
| Va+8*ΔV | | | V |

Fig. 11

| sequence | Program Operation |
|---|---|
| 1 | WL0, (page 0 → 15 programming with the ordering) |
| 2 | WL1, (page 0 → 15 programming with the ordering) |
| 3 | WL2, (page 0 → 15 programming with the ordering) |
| 4 | WL3, (page 0 → 15 programming with the ordering) |
| ↓ | ↓ |
| | |
| | |
| 63 | WL62, (page 0 → 15 programming with the ordering) |
| 64 | WL63, (page 0 → 15 programming with the ordering) |

BY WORD LINE PGM

By page programming sequence
Program from SSL to CSL side

| sequence | Program Operation |
|---|---|
| 1 | Page 0, (WL63→ 0 programming with the ordering) |
| 2 | Page 1, (WL0→ 63 programming with the ordering) |
| 3 | Page 2, (WL63→ 0 programming with the ordering) |
| 4 | Page3, (WL0→ 63 programming with the ordering) |
| ↓ | ↓ |
| 15 | Page 14, (WL63→ 0 programming with the ordering) |
| 16 | Page 15, (WL0→ 63 programming with the ordering) |

BY PAGE PGM

US 9,685,233 B2

PROGRAMMING MULTIBIT MEMORY CELLS

RELATED APPLICATIONS

This application claims the benefit of U.S. Provisional Patent Application No. 61/752,985 filed on 16 Jan. 2013, which application is incorporated by reference as if fully set forth herein.

BACKGROUND

Field of the Invention

The present invention relates to high density memory devices, and particularly the operation of devices using stacked memory structures.

Description of Related Art

As critical dimensions of devices in integrated circuits shrink toward perceived limits of manufacturing technologies, designers have been looking to techniques to achieve greater storage capacity, and to achieve lower costs per bit. Technologies being pursued include storing multiple bits per cell and stacking multiple planes of memory cells on a single chip.

Programming operations for multiple bit per cell technologies can consume significant amounts of time, compared to single bit per cell implementations, because of the requirement to establish multiple program levels. Also, such multiple bit per cell technologies can involve a greater number of program pulses during a program cycle, which can cause greater disturbance of the data held in cells not target of the program operation.

3D memory structures are very dense, but the density can also contribute to problems with disturbance of neighbor cells during programming.

Thus, it is desirable to provide for a technology for programming multiple bit per cell memories, in both 2D and 3D memories, with improved speed and performance.

SUMMARY

A method is provided to operate a multiple bits per cell memory, comprising applying a one-pass, multiple-level programming, using a single pulse sequence one time (or in one-pass), such as an incremental pulse program sequence, with program verify steps for multiple target program levels, to program multiple bits per cell in a plurality of memory cells. Using these techniques, the number of program pulses required, and the time required for programming the data can be reduced. As a result, an improvement in programming throughput and a reduction in disturbance conditions are achieved. Variants of the one-pass, multiple-level programming operation can be adopted for a variety of memory cell types, memory architectures, programming speeds, and data storage densities.

A method is provided for example, to operate a multiple bits per cell memory, which comprises applying programming in two phases. The two phase procedure can include for example, a first one-pass, incremental pulse program sequence with at least one program verify step for at least one preliminary program level; and then applying a one-pass, incremental pulse program sequence with program verify steps for multiple target program levels, to program multiple program levels in a plurality of memory cells. Utilizing a two phase program procedure can result in tightened distributions and less disturbance.

A method is provided for another example, to operate a multiple bits per cell memory, comprising storing a data set for programming a plurality of multi-level memory cells, the data set indicating one of a plurality of program states or an inhibit state for each memory cell in the plurality, where the plurality of program states correspond to a corresponding plurality of target program level for the multi-level memory cells. For the data set, the method includes executing a plurality of program cycles for the plurality of multi-level memory cells, wherein a program cycle in the plurality of program cycles includes applying a program bias to multi-level memory cells in the plurality of program states, and after applying the program bias applying program verify steps for more than one of the plurality of program levels to change the data set program states to the inhibit state for the multi-level memory cells in the plurality which pass verify at the indicated target program level. The data set can be applied in each cycle in the one-pass, multiple-level operation to determine inhibit and program states for the selected cells.

For 3D embodiments, variants of the one-pass, multiple-level program operation can include grouping memory cells by layers to reduce vertical disturb. Also, variants of the one-pass, multiple-level program operation can include executing a sequence of programming operations over a block of cells in order by-page, instead of by-word line.

Other aspects and advantages of the present invention can be seen on review of the drawings, the detailed description and the claims, which follow.

BRIEF DESCRIPTION OF THE DRAWINGS

FIG. 5 is a graph showing the threshold voltage Windows for flash memory in multiple bit per cell configurations.

FIG. 6 is a chart illustrating a prior art multiple bit Purcell programming procedure involving multiple passes, with one verify level per pass.

FIG. 11 is a table illustrating variance on one-pass, multiple-level programming operations; in which program verify steps are executed based on the pulse count or pulse level of the programming pulse in the sequence.

DETAILED DESCRIPTION

Figure 1:
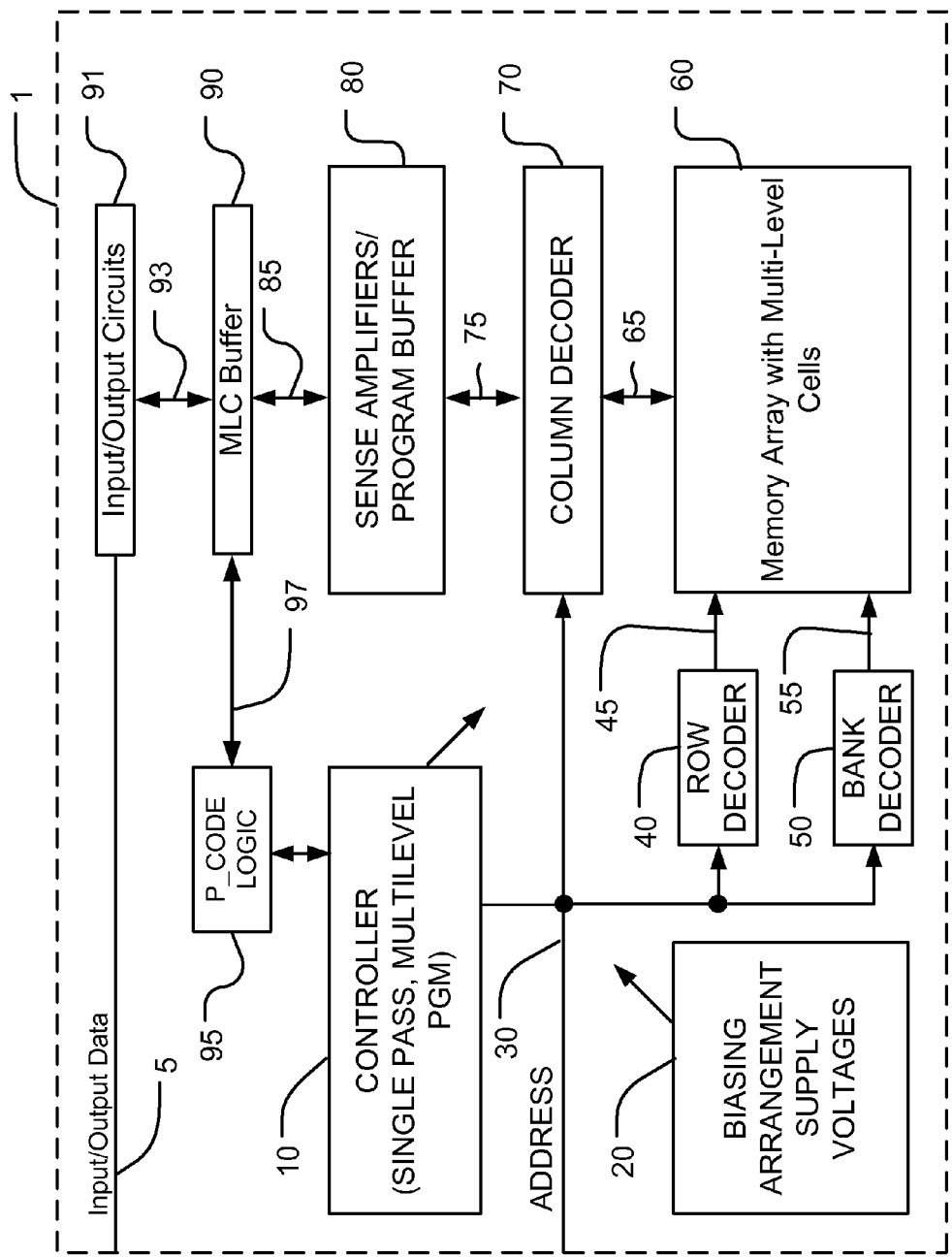
FIG. 1 is a block diagram of an integrated circuit memory employing memory cells and bias circuitry according to embodiments of the present invention configured for one-pass, multiple-level programming procedures as described herein.

A detailed description of embodiments is provided with reference to the FIGS. 1-30. FIG. 1 is a simplified chip block diagram of an integrated circuit 1 configured for one-pass, multiple-level programming operations. The integrated circuit 1 includes a memory array 60 including multiple-level cells MLC that store more than one bit of data per cell, on an integrated circuit substrate.

A row decoder 40 is coupled to a plurality of word lines 45, and arranged along rows in the memory array 60. A bank decoder 50 is coupled to a plurality of bank select lines 55 (such as SSL lines and GSL lines). A column decoder 70 is coupled to a plurality of bit lines 65 arranged along columns in the memory array 60 for reading data from and writing data to the memory array 60. Addresses are supplied on bus 30 from control logic 10 to column decoder 70, and row decoder 40. A sense amplifier and program buffer circuits 80 are coupled to the column decoder 70, in this example via a first data lines 75. The program buffer in circuits 80 can store program codes for multiple-level programming, or values that are a function of the program codes, to indicate program or inhibit states for selected bit lines. The column decoder 70 can include circuits for selectively apply program and inhibit voltages to bit lines in the memory in response to the data values in the program buffer.

Sensed data from the sense amplifier/program buffer circuits are supplied via a second data lines 85 to multi-level data buffer 90, which is in turn coupled to input/output circuits 91 via a data path 93. Also, input data is applied in this example to the multi-level data buffer 90 for use in support of one-pass, multiple-level program operations.

Input/output circuits 91 drive the data to destinations external to the integrated circuit 1. Input/output data and control signals are moved via data bus 5 between the input/output circuits 91, the control logic 10 and input/output ports on the integrated circuit 1 or other data sources internal or external to the integrated circuit 1, such as a general purpose processor or special purpose application circuitry, or a combination of modules providing system-on-a-chip functionality supported by the memory array 60.

In the example shown in FIG. 1, control logic 10 using a bias arrangement state machine controls the application of supply voltages generated or provided through the voltage supply or supplies in block 20, such as read, verify and program voltages. The control logic 10 is coupled to the multi-level buffer 90 and the memory array 60. The control logic 10 includes logic to control one-pass, multiple-level program operations described in more detail below.

The control logic 10 can be implemented using special-purpose logic circuitry as known in the art. In alternative embodiments, the control logic comprises a general-purpose processor, which can be implemented on the same integrated circuit, which executes a computer program to control the operations of the device. In yet other embodiments, a combination of special-purpose logic circuitry and a general-purpose processor can be utilized for implementation of the control logic.

The memory array 60 can comprise charge trapping memory cells configured to store multiple bits per cell, by the establishment of multiple program levels that correspond to amounts of charge stored, which in turn establish memory cell threshold voltages $V_T$. In other examples, the memory cells may comprise programmable resistance memory cells, configured for multiple bits per cell, by the establishment of multiple program levels that correspond to amounts of resistance. The description herein is based on the use of charge trapping memory cells, such as floating gate flash memory and dielectric charge trapping flash memory. The technology can be used with other memory cell technologies.

Figure 2:
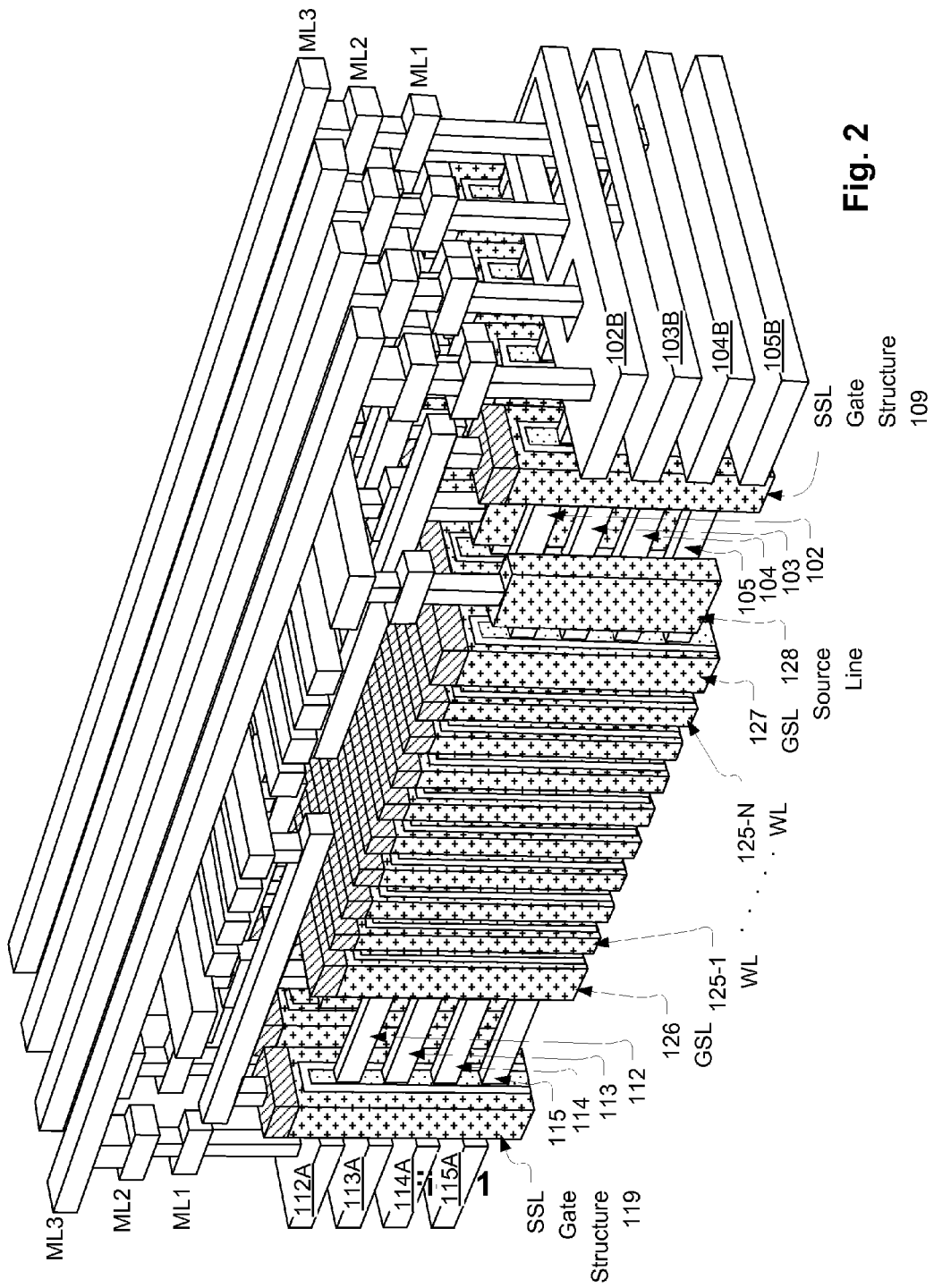
FIG. 2 is a perspective illustration of a 3D NAND-flash memory array structure suitable configured for programming as described herein.

FIG. 2 is a perspective illustration of a 3D vertical gate (3DVG) NAND-flash memory array structure used with variants of the one-pass, multiple-level programming technology. The 3D NAND-flash memory array structure is described in commonly owned U.S. patent application Ser. No. 13/078,311 filed 1 Apr. 2011, entitled "Memory Architecture of 3D Array With Alternating Memory String Orientation and String Select Structures," now Publication No. US-2012-0182806, which is hereby incorporated by reference as if fully set forth herein. Insulating material is removed from the drawing to expose additional structure. For example, insulating layers are removed between the semiconductor strips, in the ridge-shaped stacks, and are removed between the ridge-shaped stacks of semiconductor strips. The 3D NAND-flash memory array structure includes stacked memory structures resulting in the array having a plurality of memory cells disposed in a dense configuration.

The multilayer array is formed on an insulating layer, and includes a plurality of word lines 125-1, ..., 125-N. The plurality of ridge-shaped stacks includes semiconductor strips (e.g. strips 112, 113, 114, 115 in the first even page stack). The stack of semiconductor strips 112, 113, 114, 115 is terminated at one end by the stairstep pads 112A, 113A, 114A, 115A, and passes through SSL gate structure 119, gate select line GSL 126, word lines 125-1 WL through 125-N WL, gate select line GSL 127, and terminates at the other end by source line 128. The stack of semiconductor strips 112, 113, 114, 115 does not reach the stairstep pads 102B, 103B, 104B, 105B.

The stack of semiconductor strips 102, 103, 104, 105 in the first odd page stack, is terminated at one end by the stairstep pads 102B, 103B, 104B, 105B, and passes through SSL gate structure 109, gate select line GSL 127, word lines 125-N WL through 125-1 WL, gate select line GSL 126, and terminates at the other end by a source line (obscured by other parts of the figure). The stack of semiconductor strips 102, 103, 104, 105 does not reach the stairstep pads 112A, 113A, 114A, 115A.

The shown word line numbering, ascending from 1 to N going from the back to the front of the overall structure, applies for a sequence going from SLL to GSL on even memory pages. For odd memory pages, the word line numbering descends from N to 1 going from the front to the back of the overall structure, applies for a sequence going from SSL to GLS on odd memory pages.

Stairstep pads 112A, 113A, 114A, 115A terminate semiconductor strips in even pages, such as semiconductor strips 112, 113, 114, 115. As illustrated, these stairstep pads 112A, 113A, 114A, 115A are electrically connected to different bit lines for connection to decoding circuitry to select planes within the array. These stairstep pads 112A, 113A, 114A, 115A can be patterned at the same time that the plurality of ridge-shaped stacks are defined.

Stairstep pads 102B, 103B, 104B, 105B terminate semiconductor strips in odd pages, such as semiconductor strips 102, 103, 104, 105. As illustrated, these stairstep pads 102B, 103B, 104B, 105B are electrically connected to different bit lines for connection to decoding circuitry to select planes within the array. These stairstep pads 102B, 103B, 104B, 105B can be patterned at the same time that the plurality of ridge-shaped stacks are defined.

Any given stack of semiconductor strips is coupled to either the stairstep pads 112A, 113A, 114A, 115A on one end of the block, or the stairstep pads 102B, 103B, 104B, 105B on the other end of the block, but not both.

Ground select lines GSL 126 and GSL 127 are conformal with the plurality of ridge-shaped stacks, similar to the word lines.

Every stack of semiconductor strips is terminated at one end by a set of stairstep pads, and at the other end by a source line. For example, the stack of semiconductor strips 112, 113, 114, 115 is terminated at one end by stairstep pads 112A, 113A, 114A, 115A, and terminated on the other end by source line 128. At the near end of the figure, every other stack of semiconductor strips is terminated by the stairstep pads 102B, 103B, 104B, 105B, and every other stack of semiconductor strips is terminated by a separate source line. At the far end of the figure, every other stack of semiconductor strips is terminated by the stairstep pads 112A, 113A, 114A, 115A, and every other stack of semiconductor strips is terminated by a separate source line.

Bit lines and string select lines are formed at the metals layers ML1, ML2, and ML3. Local bit lines for each string of memory cells are formed by the semiconductor strips.

Memory cell transistors are formed with memory material between the semiconductor strips and the word line 125-1. In the transistors, the semiconductor strip (e.g. 113) acts as the channel region of the device. SSL gate structures (e.g. 119, 109) are patterned during the same step that the word lines 125-1 through 125-n are defined. A layer of silicide can be formed along the top surface of the word lines, the ground select lines, and over the gate structures. A layer of memory material can act as the gate dielectric for the transistors. These transistors act as string select gates coupled to decoding circuitry for selecting particular ridge-shaped stacks in the array.

Figure 3:
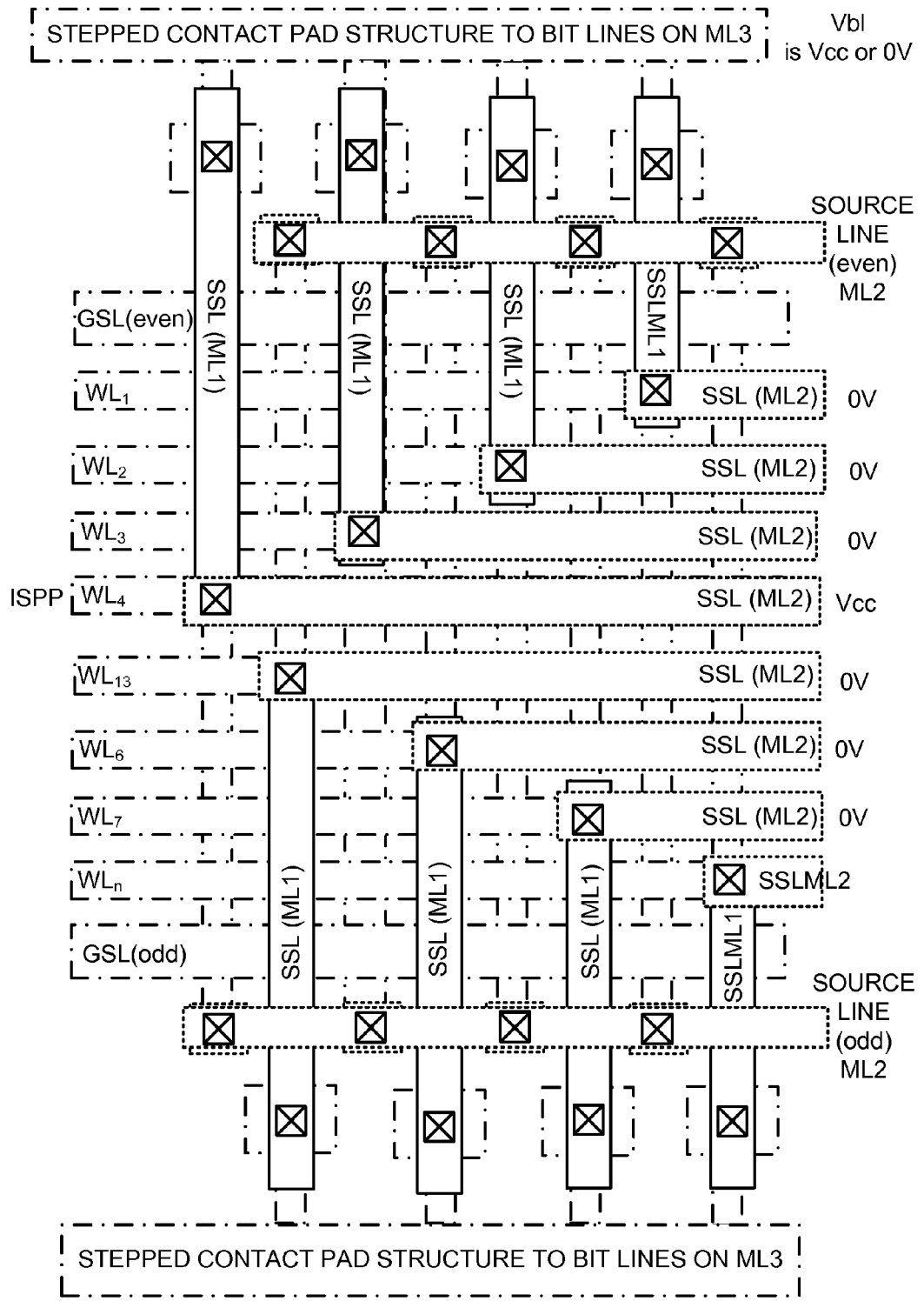
FIG. 3 is a layout view of the 3D NAND-flash memory array structure of FIG. 2 showing an example of a programming bias arrangement.

FIG. 3 is a layout view of the 3D NAND-flash memory array structure of FIG. 2 showing an example of a programming bias arrangement.

In the layout view of FIG. 3, the stacks of semiconductor strips are shown as vertical strips with dot-dash borders. Adjacent stacks of semiconductor strips alternate between the even and odd orientations. Every odd stack of semiconductor strips runs from the bit line contact pad structure at the top to the odd source line at the bottom. Every even stack of semiconductor strips runs from the bit line contact pad structure at the bottom to the even source line structure at the top.

Overlying the stacks of semiconductor strips, are the horizontal word lines and the horizontal ground select lines GSL (even) and GSL (odd). Also overlying the stacks of semiconductor strips, are the SSL gate structures. The odd SSL gate structures overlie every other stack of semiconductor strips at the top end of the semiconductor strips, and the even SSL gate structures overlie every other stack of semiconductor strips at the bottom end of the semiconductor strips. In either case, the SSL gate structures control electrical connection between any stack of semiconductor strips and the stack's corresponding bit line contact stairstep pads.

The shown word line numbering, ascending from 1 to N going from the top of the figure to the bottom of the figure, applies to odd memory pages in this example. For even memory pages, the word line numbering can descend from N to 1 going from the top of the figure to the bottom of the figure for some programming sequences.

Overlying the word lines, ground select lines, and SSL gate structures, are the ML1 SSL string select lines running vertically. Overlying the ML1 SSL string select lines are the ML2 SSL string select lines running horizontally. Although the ML2 SSL string select lines are shown as terminating at corresponding ML1 SSL string select lines for ease of viewing the structure, the ML2 SSL string select lines may run longer horizontally. The ML2 SSL string select lines carry signals from the decoder, and the ML1 SSL string select lines couple these decoder signals to particular SSL gate structures to select particular stacks of semiconductor strips.

Also overlying the ML1 SSL string select lines are the source lines, even and odd.

Further, overlying the ML2 SSL string select lines are the ML3 bit lines (not shown) which connect to the stepped contact structures at the top and the bottom. Through the stepped contact structures, the bit lines select particular planes of semiconductor strips.

Particular bit lines are electrically connected to different planes of semiconductor strips that form local bit lines. Under a programming bias arrangement, the particular bit lines are biased at either inhibit or program. The SSL of the selected stack of semiconductor strips is biased to couple the stack to the bit line contact structure, and all other SSLs are biased to de-couple the corresponding stack. The word lines are at Vpass voltages, except for the selected word line which undergoes for example an improved incremental step pulsed programming ISPP in which pulses are applied having stepped voltages, and program verify steps for multiple program levels are applied in a one-pass.

In the 3DVG structure of FIGS. 2 and 3, the memory includes a plurality of pages of memory cells, and a page can be defined for the purpose of this description as the memory cells that can be coupled in parallel to a set of N bit lines and are selected by a set of M word lines. A page can be defined in this structure as including the memory cells in one stack of semiconductor strips, selected by a single SSL switch, where each strip is coupled to a corresponding bit line via the stairstep pads. The definition of a page and the decoding applied to access a page can vary as suits a particular memory architecture. The memory structure can include a page program buffer to which the set of N bit lines is coupled in parallel, for use in the program and program verify steps described herein. In the illustrated example, there are four planes of memory cells, which provides for four bit lines per page. In other examples there are other numbers of planes. In one example considered herein, there can be eight planes, with eight even stacks and eight odd stacks, making a memory block including a total of 16 pages of eight bits each.

The memory unit can be repeated left and right, to establish wider pages, with four bits from each block in a row of blocks being selected by each word line that traverses the row of blocks. For a representative configuration storing N*8 megabytes of data in a row of blocks, an integrated circuit may include 8000 global bit lines, overlying rows of 1000 side-by-side blocks of cells each of which have sixteen pages of 512 N-bit cells coupled to eight global bit lines in the even/odd arrangement. Each row of blocks may have 64 word lines, and have a depth of eight layers making 512 cells per page. Thus, a single eight layer strip selected by an SSL signal in a single block, will include 512 cells (64*8), each storing multiple bits of data. A block of sixteen such pages will have 8K cells.

Figure 4:
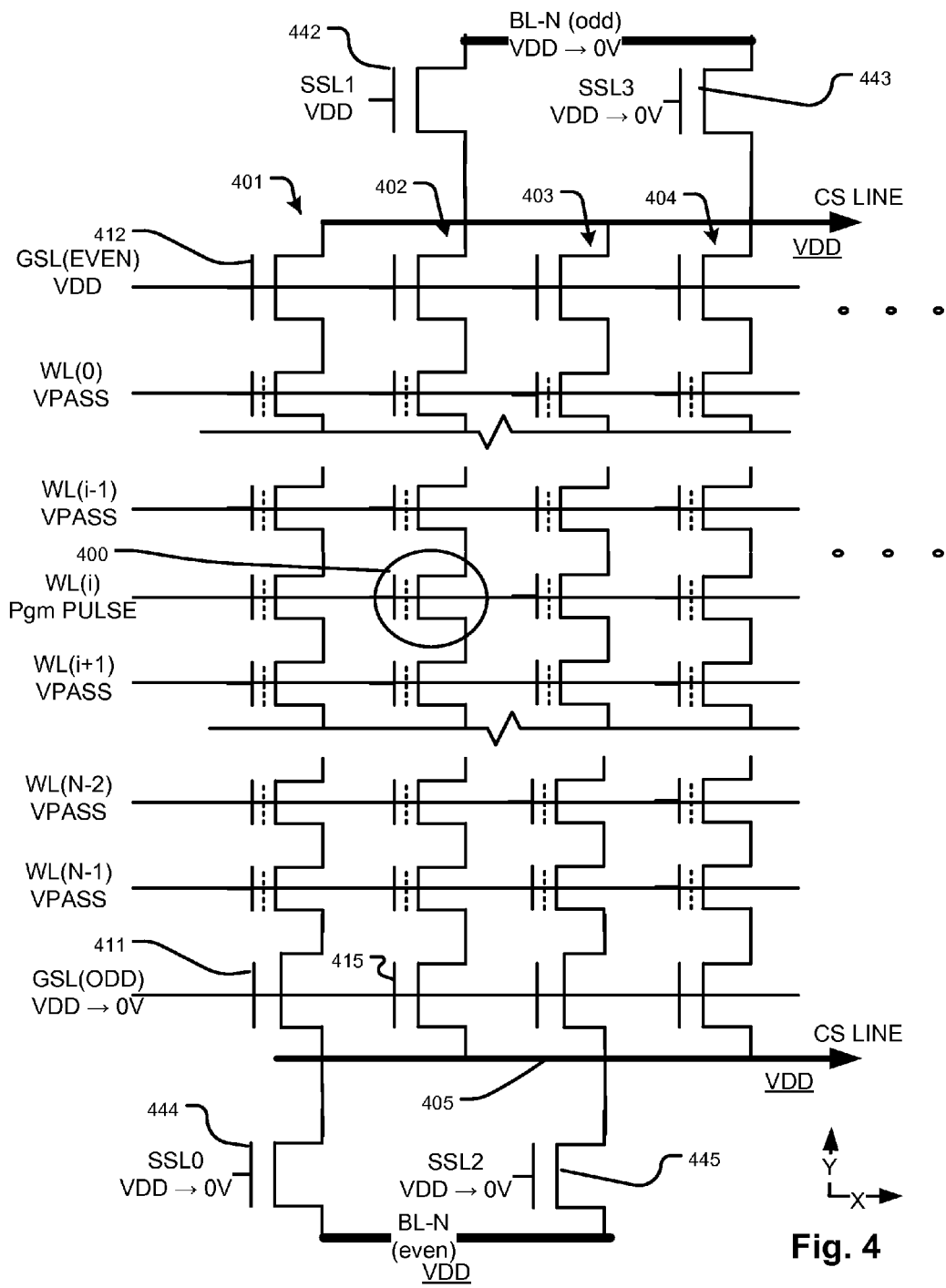
FIG. 4 is a schematic diagram of one plane in a 3-D NAND flash memory like that of FIG. 2 for which one-pass, multiple-level programming procedures can be applied.

FIG. 4 is a circuit diagram showing a circuit in a single plane (X-Y plane) in a 3D NAND array, in which there are four NAND strings 401, 402, 403, 404 including memory cells (e.g. 400). The illustrated strings 401, 402, 403, 404 can be disposed on the same level of the 3D array like that of FIG. 2, sharing even and odd GSL lines for the even and odd pages, and having separate SSL lines coupled to global bit lines BL-N at even and odd bit line contact structures on opposing ends of the block like that shown in FIG. 2, and to even and odd common source CS lines 405. The strings are connected to the corresponding global bit lines BL-1 to BL-4 by respective string select transistors (442, 443, 444, 445). The strings are connected to the even or odd common source line for the plane by respective ground select transistors (e.g. 411, 412).

Representative program bias voltages can be understood based on the following table.

| Signals | Voltage |
| --- | --- |
| Program WL | ISPP Steps from Va~Vc' |
| Unselected WL | Pass voltage 7~11 V |
| Selected page (select SSL) | VDD |
| (program BL) | 0 V |
| (inhibit BL) | VDD |
| Unselected page (de-select SSL) | VDD → 0 V |
| Selected GSL | VDD → 0 V |
| Unselected GSL | VDD |
| CSL | VDD |

ISPP is a well-known technique described in Suh et al., "A 3.3V 32 Mb NAND Flash Memory with Incremental Step Pulse Programming Scheme," IEEE International Solid-State Circuits Conference, 1995, page 128-130. According to the basic technique, in order to program a target memory cell to achieve a threshold within a range representing a particular data value, a sequence of program/verify steps are executed, in which each program pulse in the sequence has a magnitude stepped up relative to the previous pulse by a pulse increment. Between each pulse, a program verify potential is applied to the word line of the cell, and the data is sensed, to determine whether the cell threshold exceeds the program verify level. The program verify level is set at the low end of the range suitable for the target data value.

Additional details concerning a variety of program operations for 3D flash memory can be seen in commonly owned, and co-pending, U.S. Patent Application Publication No. 2013/0182505, entitled FLASH PROGRAMMING TECHNOLOGY FOR IMPROVED MARGIN AND INHIBITING DISTURBANCE by Liu et al., (1985-1) which is incorporated by reference as if fully set forth herein.

In FIG. 4, the selected memory cell 400 is disposed in the NAND string 402 and connected by the SSL transistor 442 to the bit line BL-N (odd). The signal SSL1 connected to the SSL transistor 442 is bias at VDD, while the selected bit line is biased at about the same level which tends to isolate the drain side of the string from the bit line. The signal GSL (odd) connected to the GSL transistor 415 is biased first at about VDD and falls to 0V for programming. Drain side pass voltages are applied to the word lines WL(0) to WL(i−1) having a magnitude of about 7 to 9 Volts in this example. Source side pass voltages of about 7 to 9 Volts are applied to the source side word lines WL (i+1) through WL (N−1). The selected word line WL(i) receives a program pulse that depends on the step of the programming sequence. The unselected strings coupled to the SSL transistors 443, 444, 445 are biased to inhibit disturbance of the charge stored in the memory cells. For the string 404 which is connected to the SSL transistor 443 and arranged for connection to the selected bit line BL-N (odd), the SSL3 signal is set to isolate the bit line BL-N (odd) from the string 404. For the strings 401 and 403 having SSL transistors 444, 445 connecting the strings to the unselected bit line BL-N (even), the signals SSL0 and SSL2 on the gates are set to isolate the transistors on the source side of the selected cell from the unselected bit lines. Also, the even and odd GSL lines coupled to the GSL transistors (e.g. 411, 412) receive a bias of about VDD or VDD falling to 0V, coupling the drain side (drain side of selected cell) region 422 to the common source line.

FIG. 5 illustrates the threshold voltage distributions for multiple-level flash memory cell using a graph of a count of memory cells versus threshold voltage. For a typical flash memory cell storing two bits per cell, the threshold distributions include four ranges corresponding to data values "11", "10", "00" and "01", with suitable read windows between them. In this example, an erased state memory cell for the data values "11", and will have a threshold voltage in the distribution range 500. A first program state memory cell for the data values "10", will have a threshold voltage in the distribution range 501. A second program state memory cell for the data values "00", will have a threshold voltage in the distribution range 502. A third program state memory cell for the data values "01", will have a threshold voltage in the distribution range 503. In operation, a multiple-level cell can be programmed using a program verify level of PV1 to establish the range 501, a program verify level of PV2 to establish the range 502, and a program verify level of PV3 to establish the range 503. The distributions have reasonable space between them allowing a read margin. Thus a read operation to detect the multiple levels can apply read voltages between the threshold ranges such as RD1, RD2 and RD3 is illustrated.

FIG. 6 is a diagram which illustrates the multiple pass ISPP procedure used in prior art techniques for programming multiple bits per cell. The first line 510 represents a pass used to erase a block of memory cells, setting all the memory cells in the block to the range 520. This erase operation can execute using an erase verify EV voltage. For a memory cell having three program levels, three passes of the ISPP procedure are utilized as represented by lines of 511, 512, 513. In the first pass 511, the program verify level PV3 is set to establish the high threshold range 523. In the second pass 512, the program verify level PV2 is set to establish the intermediate threshold range 522. In the third pass 513, the program verify level PV3 is set to establish the low threshold range 521. A number of variants of the multipass, multiple-level programming operation can be applied. For example, the program cycles can include applying program pulses on a selected word line, with pass voltages on unselected word lines. Each succeeding cycle for each program level and program verify voltage, can apply a program pulse of increasing magnitude.

For a first example, multipass parameters such as the following can be applied:

First pass: PV1 verify with program pulse magnitude from Va to Va'.

Second pass: PV2 verify with program pulse magnitude from Vb to Vb'.

Third pass: PV3 verify with program pulse magnitude from Vc to Vc'.

ISPP voltages range from Va to Vc' using a constant step $\Delta V$.

For a second example, multipass parameters such as the following can be applied:

First pass: PV1 verify with program pulse magnitude from Va to Va', step $\Delta V1$.

Second pass: PV2 verify with program pulse magnitude from Vb to Vb', step $\Delta V1$.

Third pass: PV3 verify with program pulse magnitude from Vc to Vc', step $\Delta V2$.

Where $\Delta V2 > \Delta V1$.

This second example can result in a wider distribution of the high threshold range for PV3, but can reduce the number of program cycles required.

It can be understood that requiring three passes of multi-pulse program procedures can consume a significant amount of time. Also, each pulse creates a risk of disturbance of neighboring memory cells.

Figures 7, 8A, 8B:
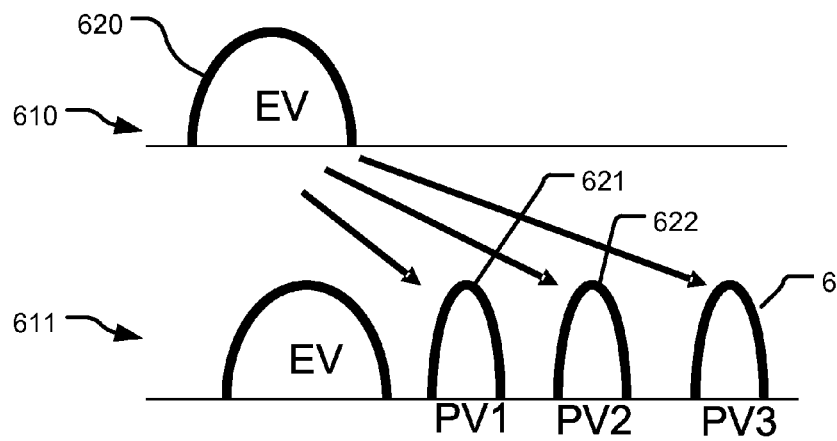
FIG. 7 is a table illustrating generation of programming control signals which can be utilized in one-pass, multiple level programming procedures as described herein.
FIG. 8A is a chart illustrating a one-pass, multiple level programming procedure.
FIG. 8B is a table comparing the traditional multi-level cell programming operation with a one-pass, multiple level programming operation as described herein.

It is desirable therefore to reduce the time and disturbance caused for programming. Thus, one-pass, multiple-level programming operations are described. In embodiments described herein, the input data for multiple bit per cell memory is converted to program control signals used for controlling program cycles during the one-pass. FIG. 7 is a table that illustrates a mapping of data values to program control signals that indicate a need to use a particular program verify level for each cell. The program control signals can be stored in the multiple-level buffer on the circuit of FIG. 1, in the program buffer, or in other memory available to the controller.

This mapping can be used to generate program codes used by logic to implement a one-pass, multiple-level program operation. The program control signals or other program codes can be stored in the multiple-level buffer on the circuit of FIG. 1, in the program buffer, or in other memory available to the controller.

The program control signals, designated p_code herein, can include one bit per verify level, and for two bit cells is produced according to the table shown in FIG. 7. Thus, for input data "11", the p_code is (1, 1, 1). For input data "10" the p_code is (0, 1, 1). For input data "00", the p_code is (1, 0, 1). For input data "01", the p_code is (1, 1, 1). The p_code indicates the verify level to be applied to the cell during the program operation. Also, a logical function of the p_code can be used to determine whether to inhibit or program the bit line. If the p_code is (1, 1, 1), then a logical AND can be used to set the bit line in an inhibit mode if the result is "1", and to set the bit line in a program mode if the result is "0", indicating that at least one of the threshold levels is to be set, and has not passed verify.

FIG. 8A illustrates a one-pass, multiple-level program operation in the style of FIG. 6, and includes a first line 610 which corresponds to the erase pass, in which all of the cells are set in the threshold range 620. The second line 611 corresponds to the one-pass, multiple-level program operation used to establish memory cells in a single page in all three ranges 621, 622, 623, utilizing three program verify levels PV1, PV2 and PV3. The three passes of the ISPP procedure represented by FIG. 6 are replaced by a one-pass, multiple level program operation.

For a one variant of the one-pass, multiple level operation, parameters such as the following can be applied:

One pass: PV1 verify, PV2 verify and PV3 verify with program pulse magnitude from Va to Vc'.

ISPP voltages range from Va to Vc' using a constant step $\Delta V$.

FIG. 8B is a table comparing the traditional multipass, multiple-level program operation as represented by FIG. 6 with the one-pass, multiple-level program operation illustrated in FIG. 8A. In the traditional operation, a first pass ISPP cycle is executed using PV3 starting with program pulses at a voltage level Vc, and proceeding to an ending voltage level Vc'. The step for each pulse is a constant $\Delta V$ in this example. The number of program shots for the PV3 pass can be determined by the difference between Vc' and Vc, divided by the size of the step $\Delta V$, plus an additional cycle. A second pass ISPP cycle is executed using PV2 with program pulses starting at a voltage level Vb, and proceeding to an ending voltage level Vb' with a constant step size ΔV. The number of program shots for the PV2 pass can be determined by the difference between Vb' and Vb, divided by the size of the step ΔV, plus an additional cycle. A third pass ISPP cycle is executed using PV1 with program pulses starting at a voltage level Va, and proceeding to an ending voltage level Va' with a constant step size ΔV. The number of program shots for the PV1 pass can be determined by the difference between Va' and Va, divided by the size of the step ΔV, plus an additional cycle.

For the one-pass, multiple-level program, labeled in the figure the one-pass, multi-level operation, there is one-pass executed using all three program verify levels, starting with program pulses at a voltage level Va, like that of the traditional PV1 pass, and ending at a voltage level Vc', like that of the traditional PV3 pass. Because the voltage pulse height ranges Va-Va', Vb-Vb' and Vc-Vc' overlap significantly, there are far fewer pulses applied in the OTM cycle.

A basic example of a procedure which can be executes by a controller for a flash memory, for a one-pass, multiple-level program operation includes the following:

(1) Multiple-level data is received and a p_code is produced for each bit line in the page.

(2) A multiple-level verify operation is executed, to determine whether the cells verify at the level indicated by the p_code.

(3) The p_code is updated based on the verify operation.

(4) Then it is determined whether all cells in the page have the target threshold levels as indicated by the p_code.

(5) If not all cells are verified, then the p_code is used to determine program or inhibit status for bit lines in the page, and an program pulse is applied, while increasing the program pulse magnitude on each pass.

(6) The multiple-level verify is repeated after all (or most as explained below) of the pulses until the page is programmed or an error is encountered.

Figure 9:
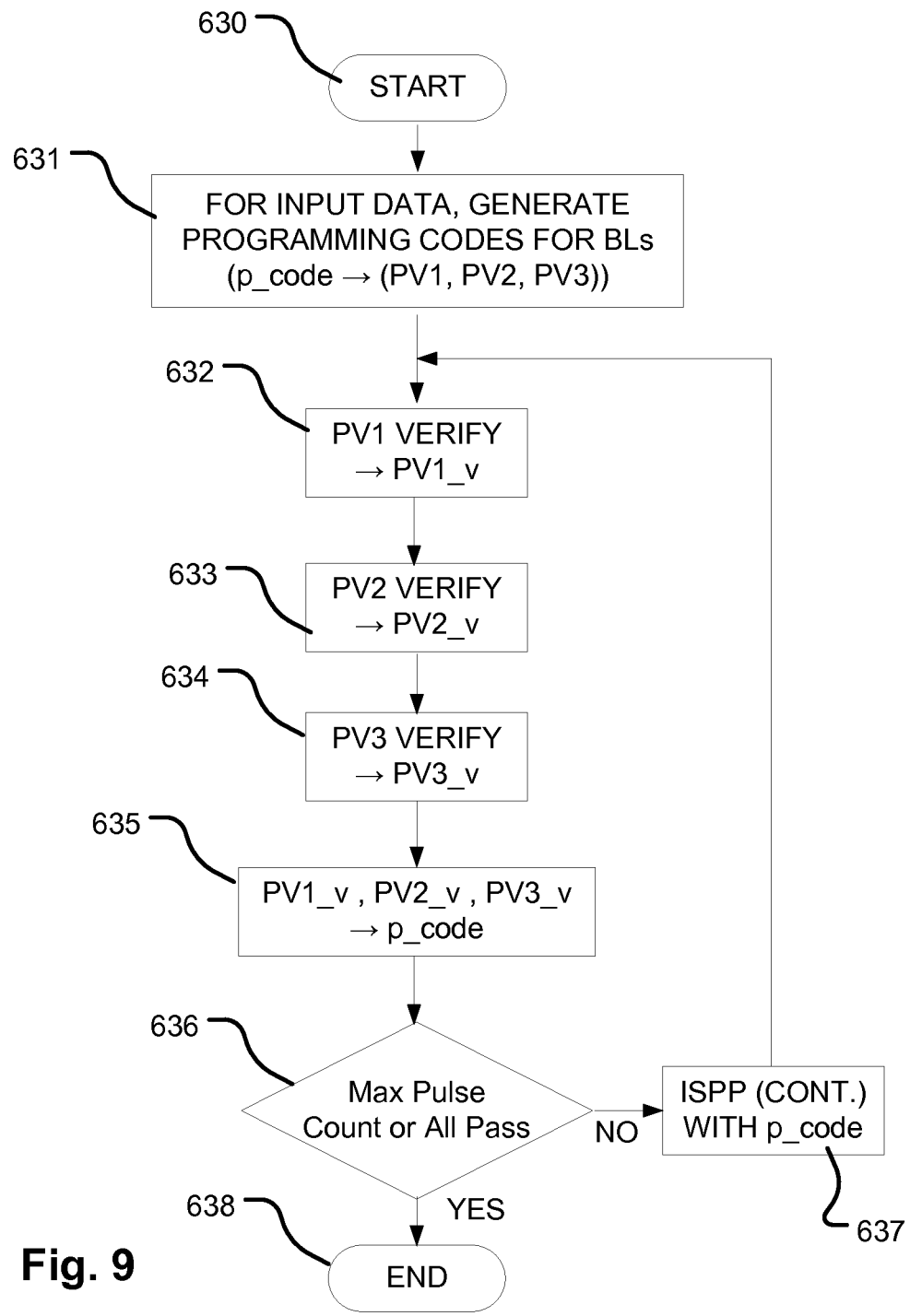
FIG. 9 is a flowchart of a one-pass, multiple level programming procedure according to one embodiment.

FIG. 9 is a simplified flowchart for a one-pass, multiple-level program operation. The diagram as a starting block 630. The procedure involves taking the input data and generating p_codes for each of the bit lines to be programmed in parallel (block 631). The p_code indicates the verify level to be applied to the bit line during the program operation. Also, a logical function of the p_code can be used to determine whether to bias the corresponding bit line for inhibit or program on a per pulse basis. For example, a logical AND of the three bits in the p_code can be used to set the bit line in an inhibit mode if the result is "1", and to set the bit line in a program mode if the result is "0", indicating that at least one of the threshold levels is to be set, and has not passed verify.

After generating the p_codes for all the bit lines to be programmed, a verify pass can be executed which includes one verify step for each program level. Thus, at block 632, a PV1 verify step is executed during which the verify result PV1_V is generated. The result in this example is a "1" if the cell on the bit line passes verify, and a "0", if the cell on the bit line does not passed verify. At block 633, a PV2 verify step is executed during which the verify result PV2_V is generated. At block 634, a PV3 verify step is executed during which the verify result PV3_V is generated.

At block 635, the verify results are used to update the p_code. At this point, the p_code is set for the first program pulse in a sequence. The logic determines whether the maximum number of pulses has been applied, or the p_code indicates that all of the cells have passed the verify operation (636). If not, then the program operation continues, applying the current version of the p_code to select inhibit and program conditions for each of the bit lines, and applying a program pulse selected according to the procedure being utilized, such as an ISPP procedure (637). If at block 636, the p_code indicates that all of the cells have passed verify, or the maximum pulse count has been encountered, then the operation ends (638).

Figure 10:
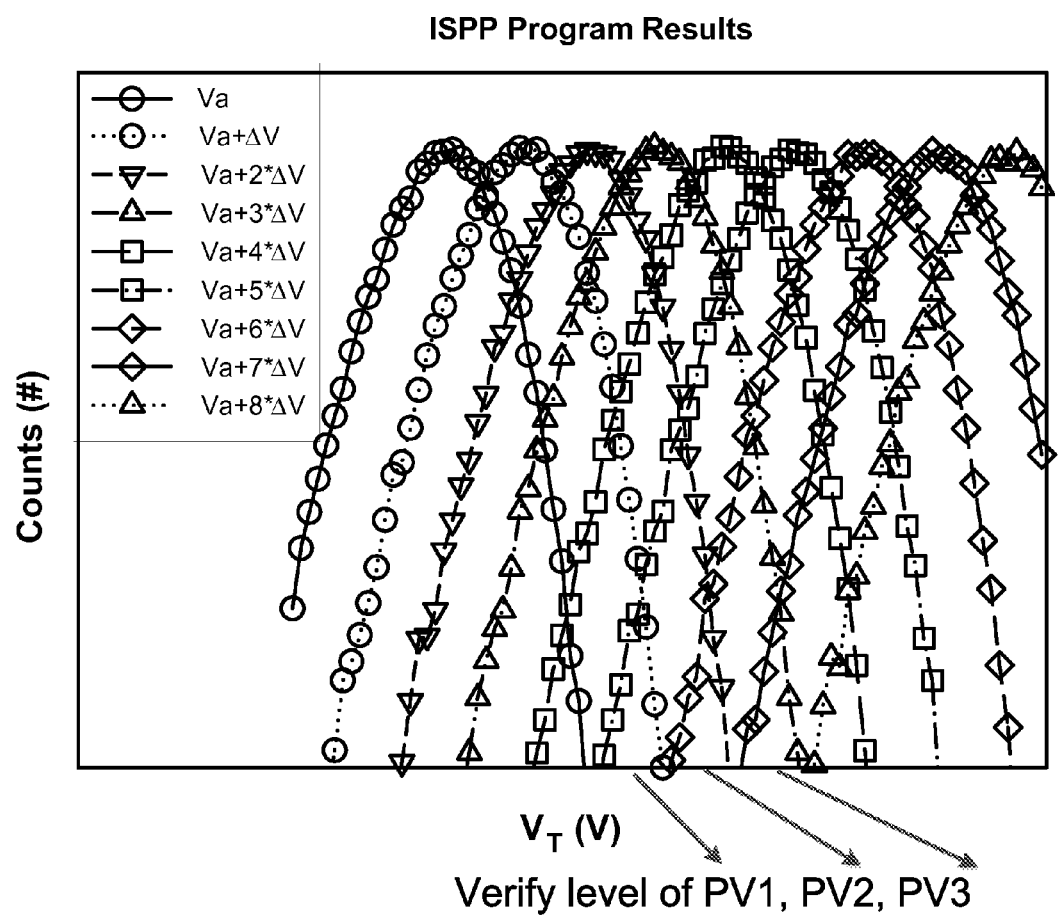
FIG. 10 is a graph showing programming results for a ISPP programming procedure, for reference in analyzing one-pass, multi-level programming operations.

FIG. 10 is a graph showing threshold voltage distribution results for a sequence of steps using a typical ISPP operation, having threshold voltage on the horizontal axis, and a count number on the vertical axis. The pulse height is indicated by the legend in the upper left. The verify levels for PV1, PV2, and PV3 are labeled on the horizontal axis. This graph illustrates that the first pulse at level Va is very unlikely to result in a cell having a threshold that passes PV1. Also, the first two pulses are very unlikely to result in a cell having a threshold that passes PV2. The first three pulses are unlikely to result in a cell having a threshold that passes PV3.

The graph also illustrates that the last three pulses are applied after cells are likely to have already passed PV1. The last two pulses are applied after cells are likely to have passed PV2. This information can be utilized to modify the one-pass, multiple-level program procedure illustrated in FIG. 9.

FIG. 11 illustrates a table that can be used to determine whether to execute a verify operation for a given program verify level after a particular pulse in the sequence. In this example, the PV1 verify is executed for all of the pulses having levels in the range Va to Va+6*ΔV. The PV2 verify is executed for all pulses having levels in the range Va+1*ΔV to Va+7*ΔV. The PV3 verifies executed for all pulses having levels in the range Va+2*ΔV to Va+8*ΔV.

Thus it can be understood that the higher program levels do not need the lower magnitude program pulses, while the lower program levels do not need to higher program pulses. This information can be used to reduce the number of verify operations required and thereby the length of time it takes to execute a program operation. Throughput is improved, and disturbance is alleviated.

Figure 12:
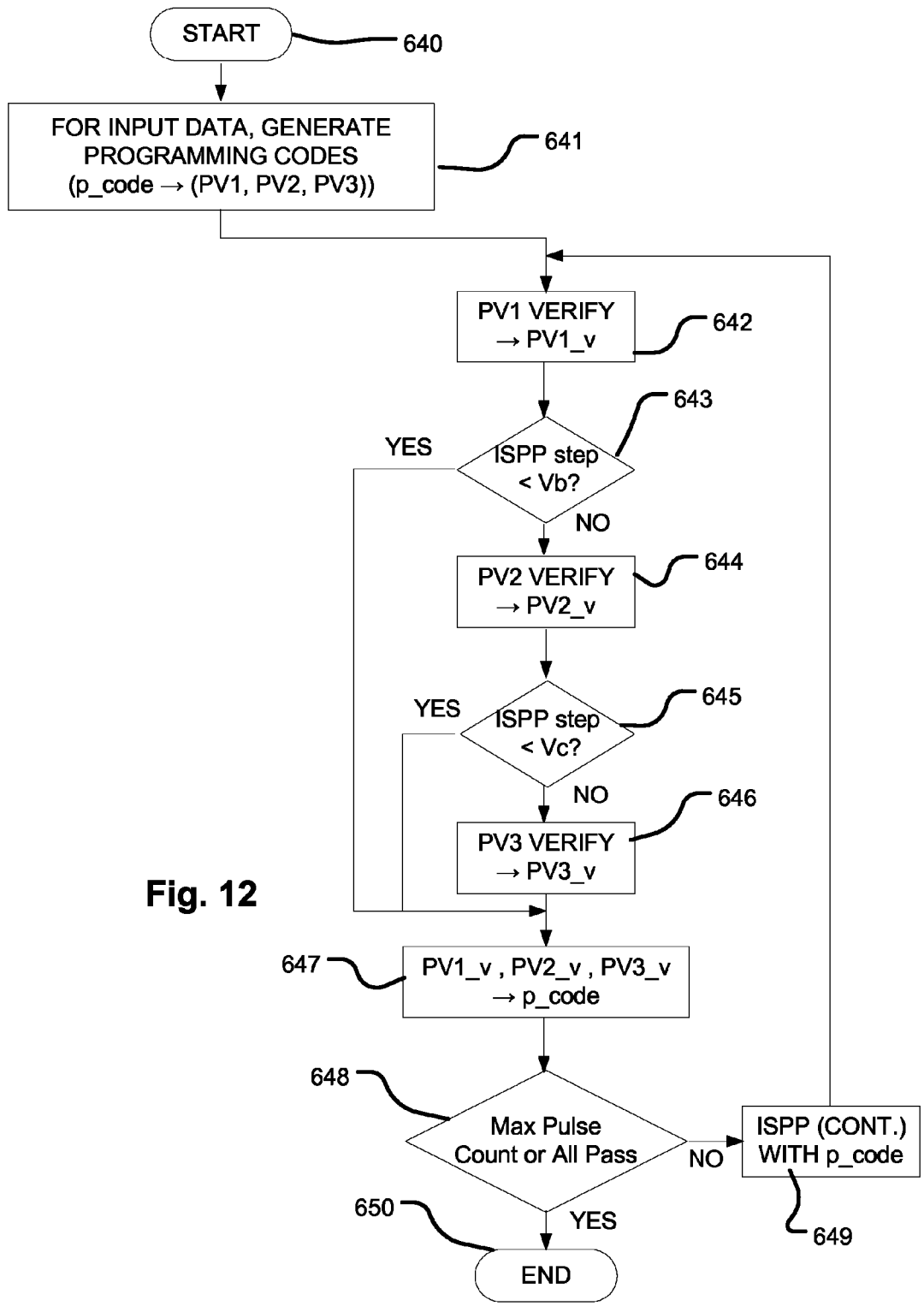
FIG. 12 is a flowchart of a first alternative one-pass, multi-level programming operation applying the concepts of FIG. 11.

FIG. 12 is a simplified flowchart showing a one-pass, multiple-level program operation which has been improved utilizing the information discussed with reference to FIGS. 10 and 11. In this example, the programming process starts at block 640. Input data is used to generate p_codes as discussed above (block 641). A verify operation is executed applying PV1, and generating the verify result PV1_V (block 642). Next, it is determined (such as by determining a pulse count) whether the ISPP step has a voltage magnitude less than Vb which is a starting magnitude applied to cells for the second program level (block 643). If the ISPP step is too low, then the process skips ahead to block 647. If the ISPP step is high enough, then a verify step is executed at PV2, and the verify result PV2_V is produced (block 644). The procedure then determines whether the ISPP step has a magnitude less than Vc, which is a starting magnitude applied to cells for the third program level (block 645). If the ISPP step is high enough, then a verify step is executed at PV3, and the verify result PV3_V is produced (block 646). If the ISPP step is to low, then the process skips ahead to block 647. At block 647, the program verify results are used to update the p_code as discussed above. The procedure then determines whether the maximum pulse count has been exceeded, and whether all cells being programmed have passed verify operations (block 648). If not, then the program procedure continues with an increased pulse height, applying the current version of the p_code to determine which bit lines to bias for inhibit and which bit lines device for program. The procedure then returns to the first verify step at block 642. If at block 648, all cells have passed and the maximum pulse count has not been exceeded, then the procedure ends at block 650.

This procedure reduces the number of verify operations to be executed at the low end of the program cycles.

Figure 13:
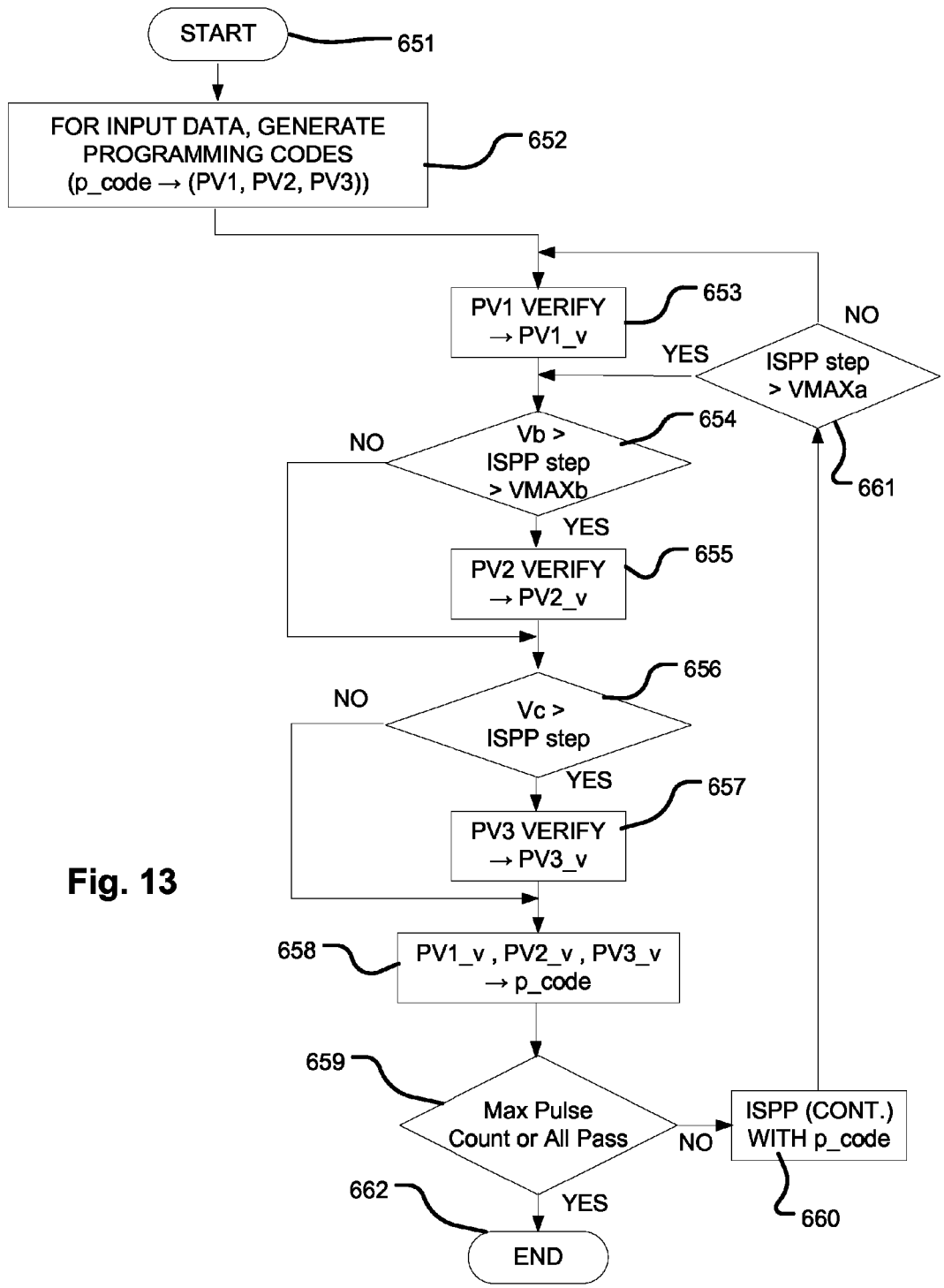
FIG. 13 is a flowchart of a one-pass, multiple level programming procedure according to another embodiment.

FIG. 13 is another improved one-pass, multiple-level procedure, which reduces the number of verify operations to be executed at both the low-end and the high end of the program cycles. The procedure begins at block 651. The input data is converted to the p_codes as explained above (652). Then a verify sequence is executed applying PV1 and generating result PV1_V at block 653. At block 654, it is determined whether the program magnitude is between the levels of pulses used to program the second program level, falling in the range Vb to VMAXb. If the current pulse falls within the range, then a verify operation is executed applying PV2 and generating the result PV2_V at block 655. If the current pulse is below the range, or above the range, in the procedure skips ahead to block 656. At block 656, the procedure determines whether the pulse height is greater than the starting pulse for the third program level at voltage Vc. If the current pulse falls above the level Vc, then a verify operation is executed applying PV3, and generating result PV3_V at block 657. If at block 656, the pulse height is below the starting pulse for the third program level, then the procedure skips ahead to block 658.

At block 658, the verify results are used to update the p_code as explained above. At block 659, the procedure determines whether all the cells have passed verify, or an error condition is encountered such as the maximum pulse count. If not, then the program operation continues applying the next pulse in the ISPP sequence controlled by the current p_code (660), the pulse count and other parameters. After applying the pulse, the procedure determines whether the ISPP step is greater than the maximum magnitude VMAXa to be applied for the first program level (661). If is not greater than the maximum, then the program verify sequence begins with a verify operation at level PV1 in block 653. If the pulse magnitude is greater than the maximum for the first program level, then the procedure skips block 653, and moves to block 654. The loop continues until all the cells pass, or an error is encountered. Thus, at block 659, if all cells pass, or maximum pulse count is encountered, the procedure ends (662).

Figure 14:
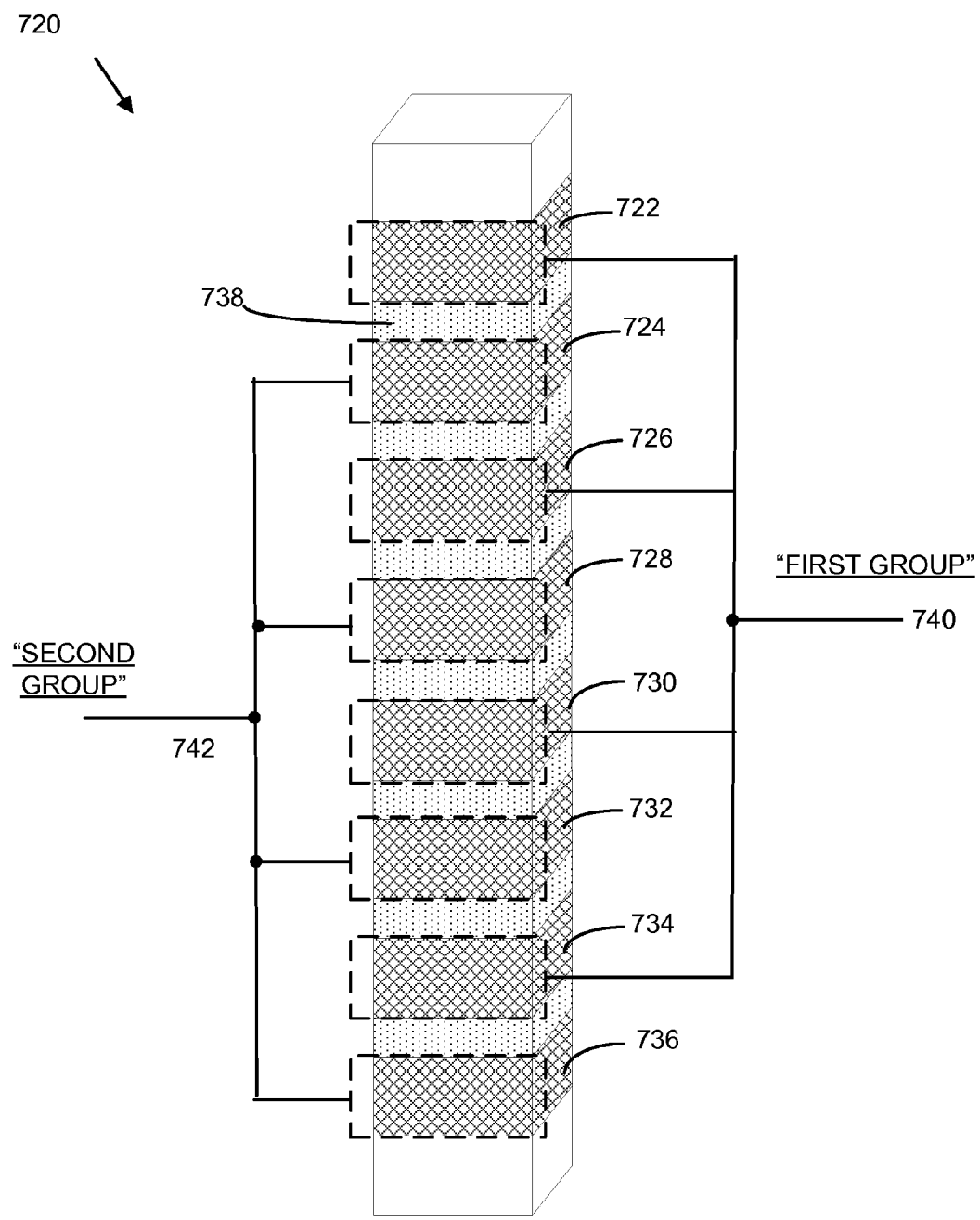
FIG. 14 illustrates a stack of memory cells for the purposes of describing grouping by layers for a programming procedure.
Figure 15:
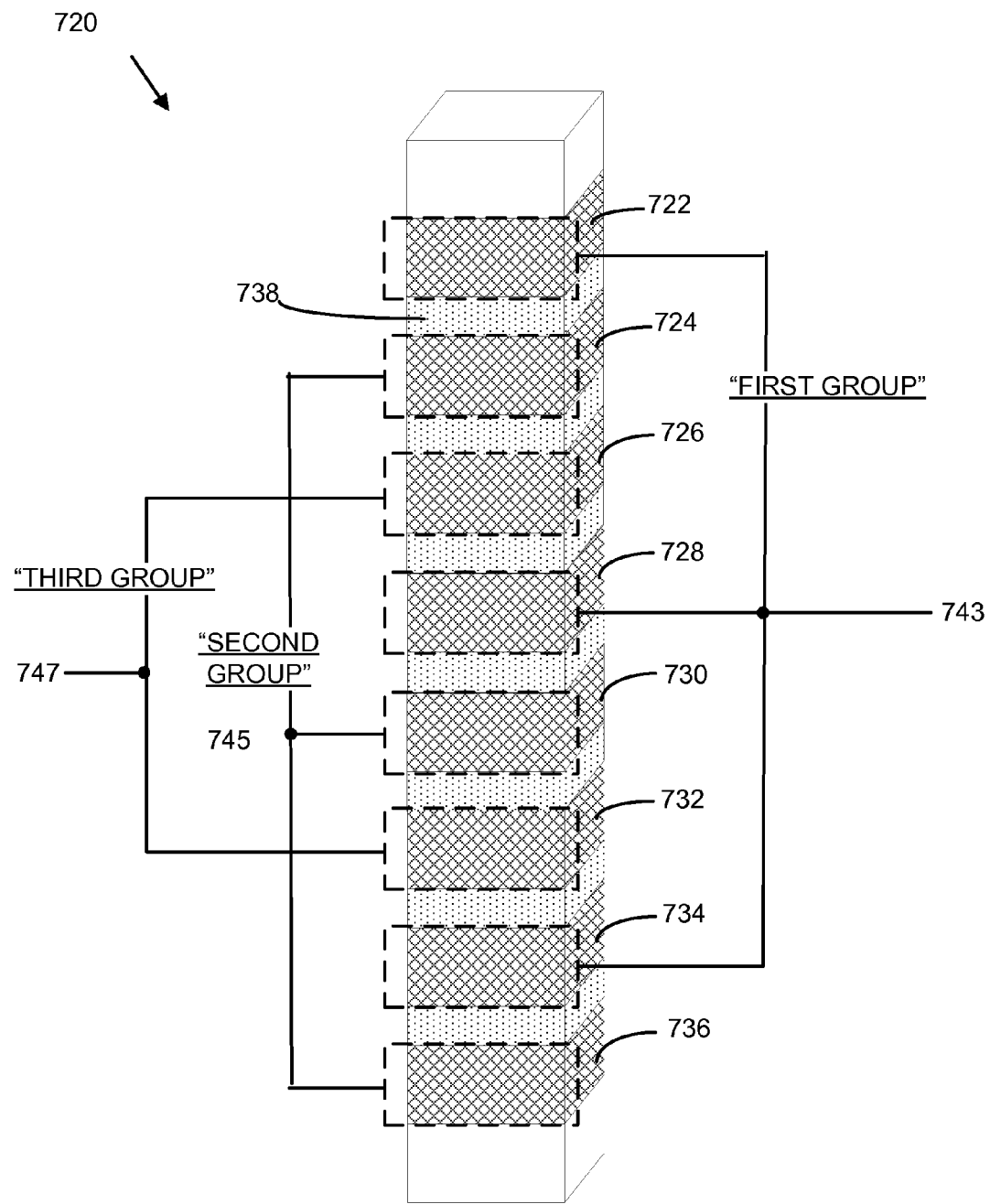
FIG. 15 illustrates a stack of memory cells with an alternative grouping.

For 3D memories, additional variants of one-pass, multiple-level operations can be executed. FIGS. 14 and 15 illustrate a stack of cells from an architecture like that of FIG. 2, selected by a single word line and a single SSL signal, that includes 8 levels of cells in a stacked memory structure, with first and second groups of layers.

FIG. 14 shows grouping of the layers in a stacked memory structure that can be applied during a programming technique. For purposes of illustration, the memory material layers and the surrounding word line are not shown. The stacked memory structure 720 includes eight bit lines 722, 724, 726, 728, 730, 732, 734 and 736, separated by insulating layers (e.g. 738 between the bit lines. The eight bit lines are electrically coupled to memory cells in the corresponding eight layers, and share a common word line structure (not shown). Then, if any memory cell in the stack is selected for programming, all of them are exposed to the high voltage in the common word line. The stacked memory structure can include any number of layers containing corresponding memory cells.

FIG. 14 illustrates a grouping of the layers of memory cells into first and second groups in order to reduce disturbance by programming adjacent cells in a single column by establishing groupings that can be programmed together, while inhibiting the unselected group cells. The organization memory cells for a particular multibit address disposed in a first group 740 of layers and a second group of layers 742 to which the program operation is applied one group at a time.

FIG. 15 shows another example organization of memory cells in the stacked memory structure during programming, which can suppress disturb and prevent over-programming. The stacked memory structure 720 includes first, second, third, fourth, fifth, sixth, seventh and eighth stacked bit lines 722, 724, 726, 728, 730, 732, 734 and 736. The organization can be characterized as including three groups of layers. In this organization, the first group 743 of layers includes the memory cells formed with the first, fourth and seventh bit lines 722, 728 and 734. The second group 745 of layers includes the memory cells formed with the second, fifth and eighth bit lines 724, 730 and 736. The third group 747 of layers includes the memory cells formed with the third and sixth bit lines 726 and 732. In the organization based on these groups of layers, the bit lines in each group of layers are separated by at least two other bit lines in two different groups of layers. The organization can be applied to a stacked memory structure that includes three or more bit lines, so that each group of layers includes any number of bit lines.

The organization of FIGS. 14 and 15 is applied during a programming operation to prevent over-programming while decreasing the amount of disturbing that occurs in unselected memory cells in the stacked memory structure 720. More information concerning grouping of layers for programming can be seen in co-pending and commonly owned U.S. patent application Ser. No. 13/827,475; entitled PROGRAMMING TECHNIQUE FOR REDUCING PROGRAM DISTURB IN STACKED MEMORY STRUCTURES (2053-1); by Hung et al.; filed 14 Mar. 2013, which is incorporated by reference as if fully set forth herein. For 3-D memories, such as that shown in FIG. 2, this grouping of layers can be applied with a one-pass, multiple-level program sequence using an procedure like that shown in FIG. 16.

Figure 16:
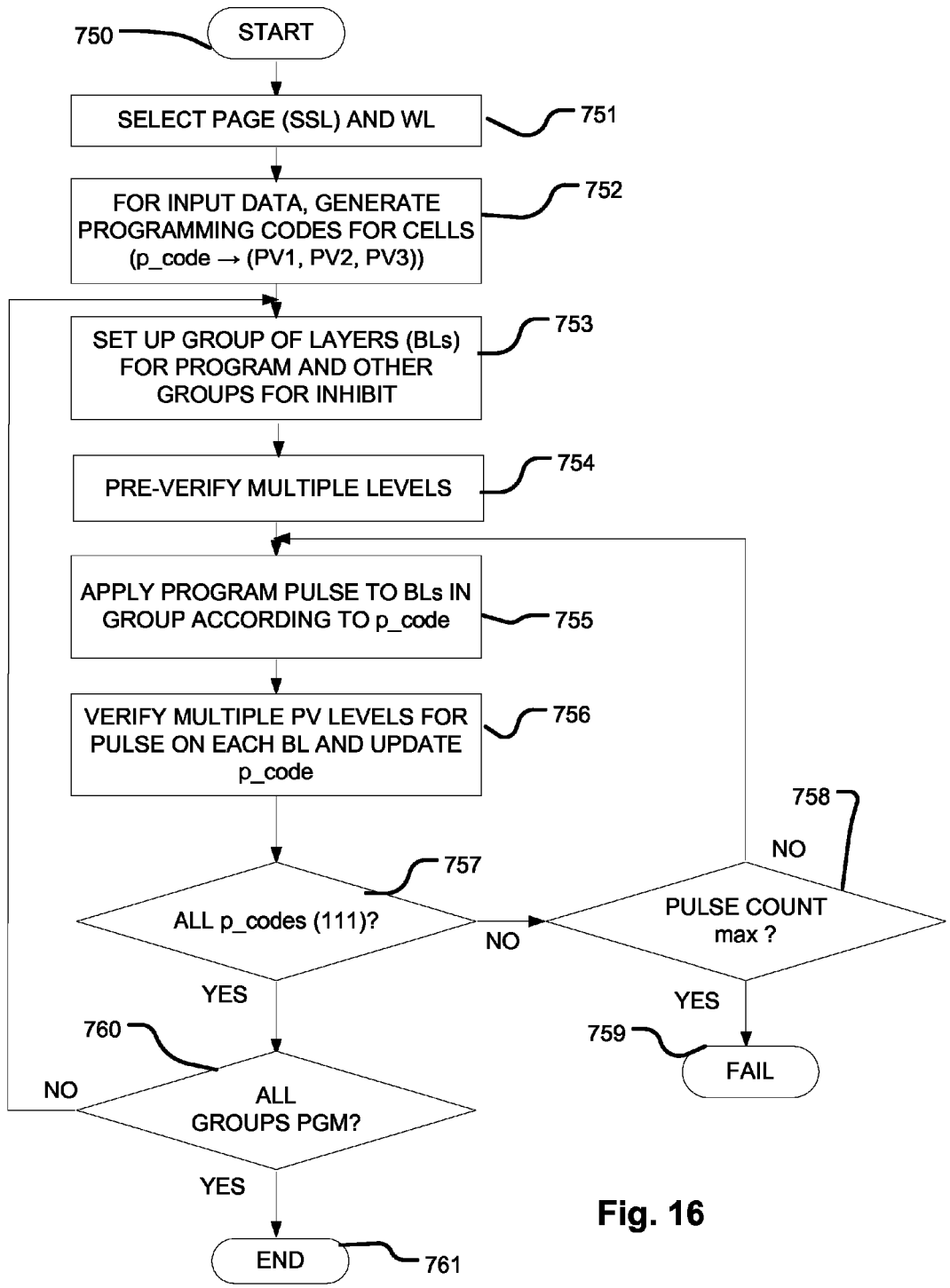
FIG. 16 is a flowchart of a procedure for one-pass, multiple level programming with grouping by layers.

A variant of one-pass, multiple-level programming operations applying a grouping process is illustrated in FIG. 16, starting at block 750. In step 751, a page and word line are selected, where page is selected using a single SSL line in the memory structure described with reference to FIG. 2. Next, the input data is used to generate the p_codes (752). The controller selects a group of layers (which corresponds to a group of bit lines in this example) to be programmed, and other groups to be placed in an inhibit mode during this cycle (753). Then a multiple level verify is executed and the results are applied to update the p_code (754). A program pulse is then applied to the bit lines in the selected group according to the p_code (755). Multiple program verify levels are applied for pulses on each bit line in the group, and results are used to update the p_code (756). At step 757, it is determined whether all the p_codes for the group of cells indicate passing for all verify levels. If not, in the procedure determines whether the pulse count has reached its maximum (758), and if not returns to step 755 to apply a next pulse in the sequence. If the pulse count is exceeded at block 758, then the procedure fails (759). If at block 757 is determined that all of the cells in the group have passed verify, then the procedure determines whether all the groups for the page have been programmed (760). Optionally, all of the word lines in the particular group could be programmed before changing groups. If not all the groups have been programmed at block 760, then the procedure loops back to block 753 to set up the next group. If all the groups of been programmed at block 760, then the procedure ends (761).

For a one variant of the one-pass, multiple level operation (OTM-1), parameters such as the following can be applied:

Partition page into N groups, where for example N can be 1, 2 or 3.

One pass for each group of layers: PV1 verify, PV2 verify and PV3 verify with program pulse magnitude from Va to Vc'.

ISPP voltages range from Va to Vc' using a constant step $\Delta V$.

Pass voltages on unselected word lines vary dynamically from $Vpass_{low}$ to $Vpass_{high}$.

For a second variant of the one-pass, multiple level operation (OTM-2), parameters such as the following can be applied:

Partition page into N groups, where for example N can be 1, 2 or 3.

One pass for each group of layers with program pulse magnitude from Va to Vc' using a constant step $\Delta V$.

PV1 verify with program pulse magnitude from Va to Va'.

PV2 verify with program pulse magnitude from Vb to Vb'.

PV3 verify with program pulse magnitude from Vc to Vc'.

Pass voltages on unselected word lines vary dynamically from $Vpass_{low}$ to $Vpass_{high}$.

For a third variant of the one-pass, multiple level operation (OTM-3_1), parameters such as the following can be applied:

Partition page into N groups, where for example N can be 1, 2 or 3.

One pass for each group of layers with program pulse magnitude from Va to Vc' using a varying increment.

PV1 verify with program pulse magnitude from Va to Va', with step $\Delta V1$.

PV2 verify with program pulse magnitude from Vb to Vb', with step $\Delta V1$.

PV3 verify with program pulse magnitude from Vc to Vc', with step $\Delta V2$. ($\Delta V1 < \Delta V2$).

Pass voltages on unselected word lines vary dynamically from $Vpass_{low}$ to $Vpass_{high}$.

For a fourth variant of the one-pass, multiple level operation (OTM-3_2), parameters such as the following can be applied:

Partition page into N groups, where for example N can be 1, 2 or 3.

One pass for each group of layers with program pulse magnitude from Va to Vc' using a varying increment.

PV1 verify with program pulse magnitude from Va to Va', with step $\Delta V$.

PV2 verify with program pulse magnitude from Vb to Vb', with step $\Delta V$.

PV3 verify with program pulse magnitude from Vc to Vc', with step $n*V2$.

Pass voltages on unselected word lines vary dynamically from $Vpass_{low}$ to $Vpass_{high}$.

Other variants of one-pass, multiple-level program operations can be applied to meet requirements of specific implementations. The variants described above illustrate some types of variations that can be applied to tune the programming operations for particular embodiments.

Figures 17, 18:
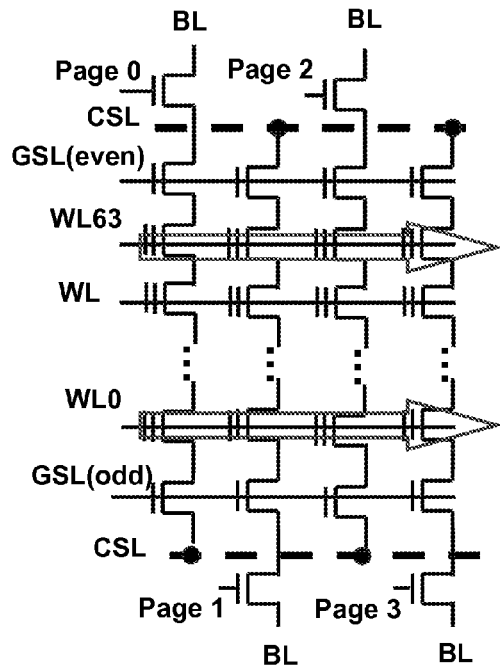
FIG. 17 is a schematic diagram illustrating by-word line programming sequences which can be utilized with one-pass, multiple level programming operations.
FIG. 18 is a table illustrating the order of programming in eight I word line programming sequence.
Figure 19:
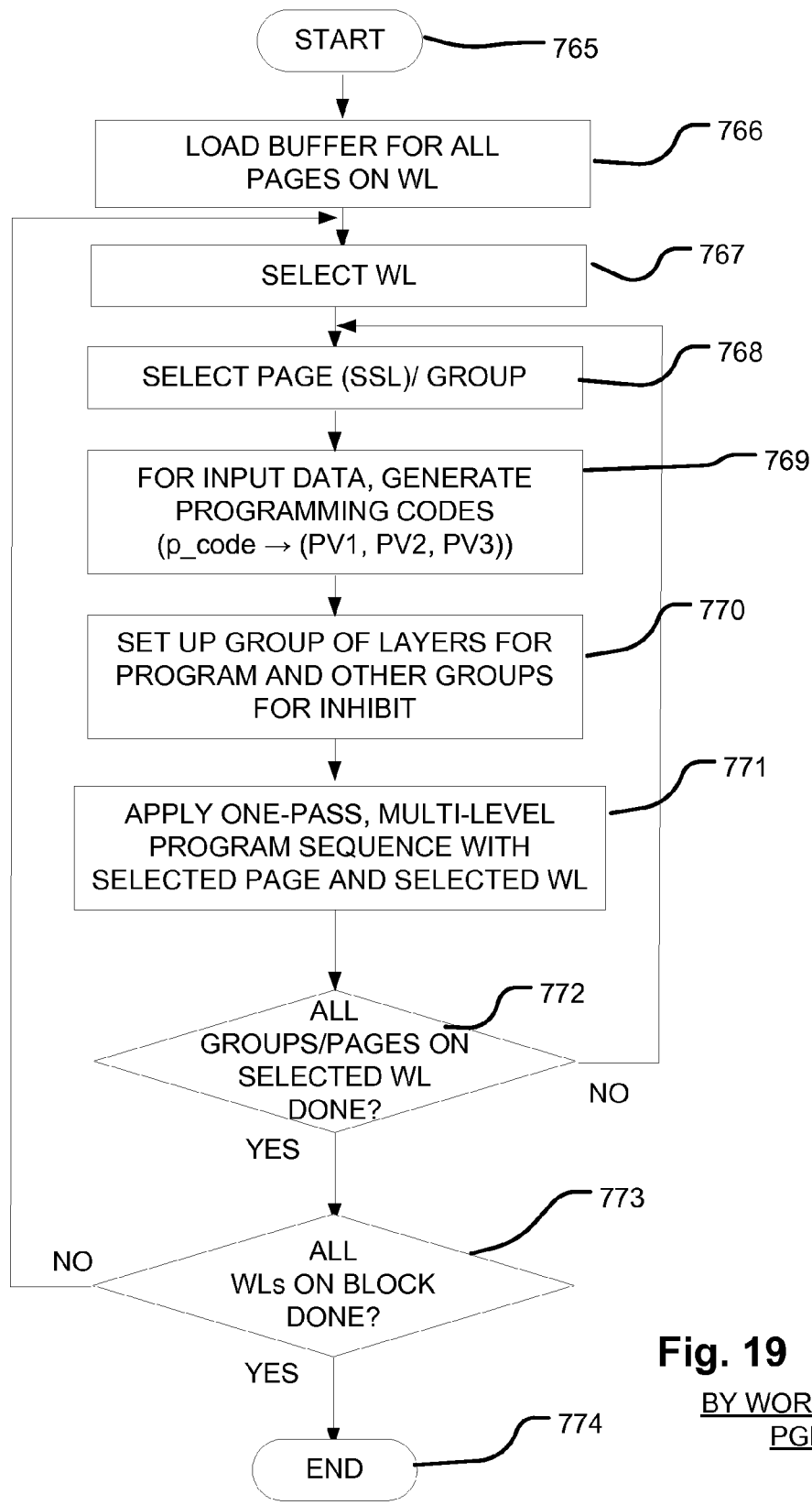
FIG. 19 is a flowchart of a procedure for by-word line programming in a one-pass, multiple level programming operation.

FIGS. 17, 18 and 19 illustrate a programming sequence which can be applied for programming an entire block of cells using a "by-word line" programming sequence. FIG. 17 is a schematic diagram of a single plane of a 3-D NAND array like that of FIG. 2. In this example, there are four NAND strings, where the first string is part of page 0, the second string is part of page 1, the third string is part of page 2, and the fourth string is part of page 3. All of the NAND strings in a single level are coupled by a stairstep structure to the same bit line in this configuration, and are selected one at a time by the even and odd SSL switches and even and odd GSL switches, as discussed above. The broad arrows illustrate by-word line programming, where a sequence such as illustrated in FIG. 18 is executed.

FIG. 18 is a table showing a sequence for programming 64 word lines in a circuit like that of FIG. 17 which has 16 pages. Sequence involves selecting a first word line, and then executing a programming operation for each of the pages 0 to 15 and sequence. This can be done with the grouping as discussed with respect to FIG. 16 if desirable on each page.

FIG. 19 is a simplified flowchart for a by-word line programming sequence starting at block 765. The procedure begins with loading a buffer for all the pages on the word line (block 766). Next, the word line is selected (block 767). In the next step, a page and a group are selected (block 768). The p_codes are then generated for the selected page and group (block 769). A group of layers is set up for program while other groups are set for inhibit (block 770). Next, a one-pass, multiple-level program sequence is applied for the selected page and group with the selected word line (block 771). The procedure then determines whether all the pages on the selected word line or done (block 772). If not, the procedure loops back to block 768 to select the next page. If all the groups in the page and all pages in the block are done at block 772, then the procedure determines whether all word lines on the block or done (block 773). If not, the procedure loops back to block 767, to select the next word line. When all the word lines are done at block 773, the procedure ends (block 774).

In a by-word line program sequence, applied to an even and odd page architecture like that shown in FIG. 2, the effective order of programming changes for the even and odd pages, with one of the even and odd pages being programmed from common source line to bit line, with the other being programmed from bit line to common source line. This results in variations in the programming results for the even and odd pages, because of the variations in bit line loading during the programming sequences. As a result, the by-word line program sequence can disturb the uniformity of the programming operation. Thus, in some embodiments it is desirable to use a by-page programming sequence, in which the word line order can be adjusted on a page basis.

Figures 20, 21:
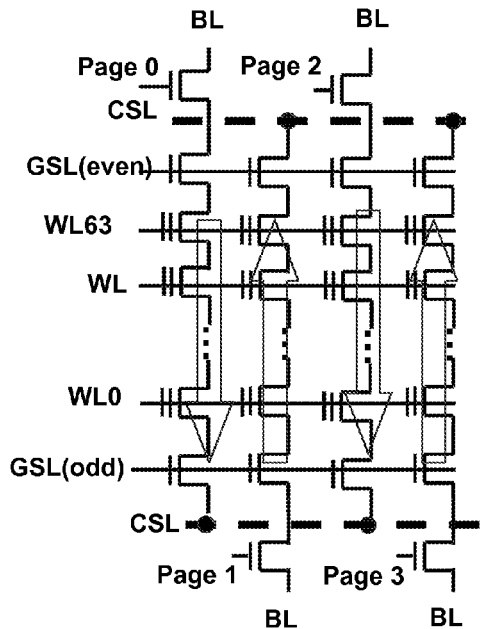
FIG. 20 is a schematic diagram of a layer of NAND flash showing by-page programming sequence.
FIG. 21 is a table illustrating the order of programming in a five page sequence.
Figure 22:
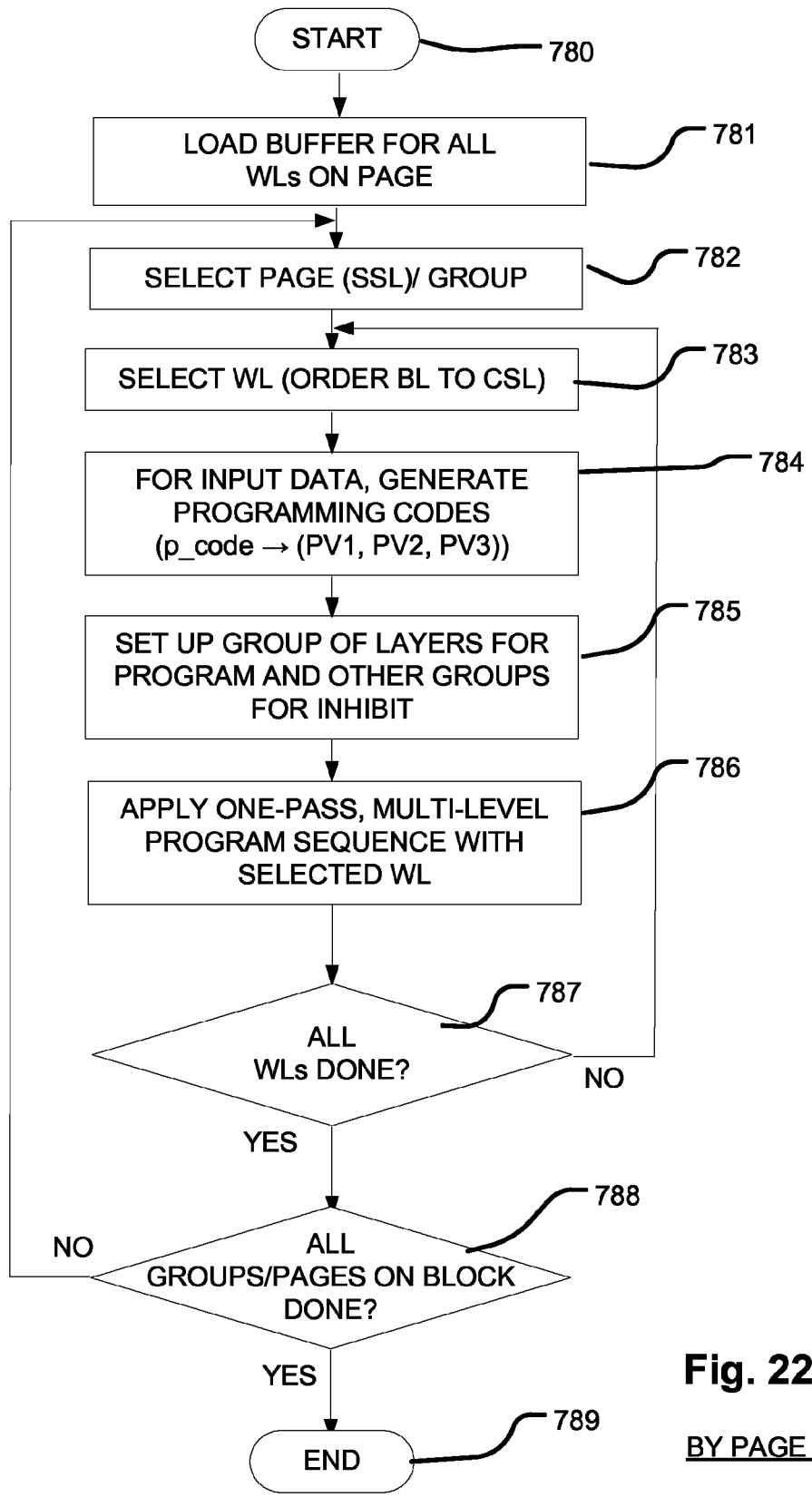
FIG. 22 is a flowchart of a procedure for applying by-page programming in a one-pass, multiple level programming operation.

FIGS. 20, 21 and 22 illustrate an alternative sequence, for programming an entire block, referred to as "by-page programming" which can alleviate disturbance, relative to the by-word line programming described above, in some embodiments. FIG. 20 illustrates the NAND circuit like that of FIG. 17. The broad arrows in this example extend downwardly and upwardly along the even and odd NAND strings on each page. The table shown in FIG. 21 illustrates the sequence. In this example, a page is selected, and then for each of the 64 word lines on the page, a program sequence is executed. For an odd page in this example, the sequence goes from word line 63 to word line 0. For an even page in this example, sequence goes from word line 0 to word line 63 in an opposite order as mentioned above with respect to FIG. 2 to preserve the order of programming from the SSL side of the string to the GSL side of the string.

FIG. 22 is a simplified flowchart of a by-page programming sequence starting at block 780. In this example, a buffer is loaded for all of the word lines on a page (781).

Next a page and a group are selected (782). A word line is next selected enforcing an order of bit line (e.g. SSL side) to common source line as mentioned above (783). Also the input data is used to generate the p_codes for the selected page, group and word line (784). A group of layers is setup for program while others groups are set up for inhibit (785). Then, a one-pass, multiple-level program sequence is applied on the selected word line and page (786). At block 787 is determined whether all the word lines on the page are done. If not, the procedure loops back to block 783 to select the next word line. If all the word lines are done, to the procedure determines whether all of the groups on the page or pages on the block are done (block 788). If not, the procedure loops back to go to end, to select the next page. If all the pages on the block are done at block 788, then the procedure ends (789).

Figure 23:
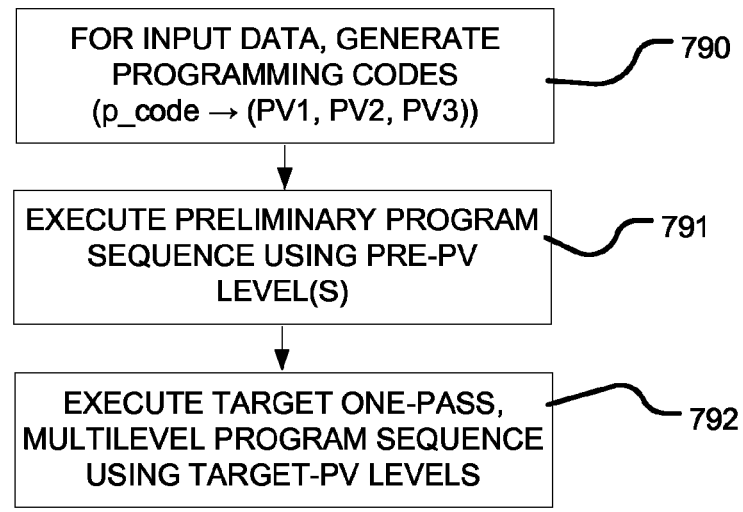
FIG. 23 is a simplified flowchart of a two phase programming operation including a limitary program sequence, and a target one-pass, multiple level programming sequence.

FIG. 23 illustrates yet another variation of programming sequences in which one-pass, multiple-level programming operations can be executed. In this example, a two-phase programming operation is executed, including a first or preliminary programming cycle executed in advance of a second or target programming cycle. As illustrated in FIG. 23 the input data is used to generate p_codes as discussed above (790). The p_codes are used to execute a first phase program sequence using preliminary program verify levels (791). Then, the p_codes are used again to execute a second phase program sequence than can be a one-pass, multiple-level program sequence using target program verify levels (792). A variety variations on the two-phase programming operations can be executed, some examples of which are explained below.

By-page and by-word line programming operations can be utilized in single level cell implementations as well. By-page programming can be configured to require smaller program buffers when applying two phase programming operations, that involve a preliminary program sequence that sets a preliminary threshold range, followed by a final program sequence that sets a target threshold range. In two phase programming operations, the data buffer must accommodate the full data set across which the two phase operation performed is performed. By-page programming, particularly in 3-D configurations like that of FIG. 2, can be configured in relatively small data sets for this purpose.

Figure 24:
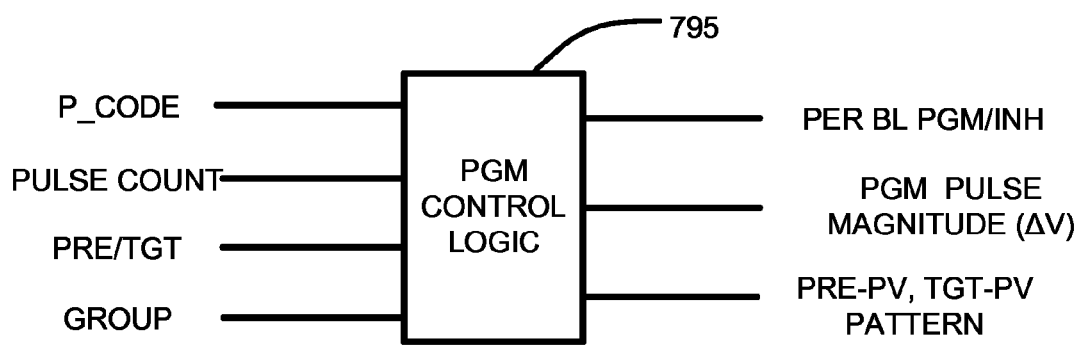
FIG. 24 is a simplified logic diagram showing input parameters and output parameters produced by program control logic on an integrated circuit, like that of FIG. 1 applying one-pass, multiple level programming operations.

FIG. 24 illustrates a characteristic of a controller 795, which can be for example a controller like that of FIG. 1, used for programming one-pass, multiple-level programming operations to produce the program and inhibit conditions for each bit line, the program pulse magnitude for each cycle, and the preliminary or target program verify pattern to be executed. The input data to the logic includes the p_code as discussed above, a pulse count so that variations can be made by pulse count in the sequence, a control signal indicating whether it is a first phase or a second phase programming cycle (labeled preliminary/target), and a control signal indicating the grouping logic parameters. This information can be used to dynamically control a variety parameters of the programming operations, including those shown in FIG. 24 and others including for example dynamic variations of pass voltages applied and NAND programming operations, and the like.

A number of variants of two phase program operations using one-pass, multiple-level operations is described with reference to FIGS. 25-29.

Figure 25:
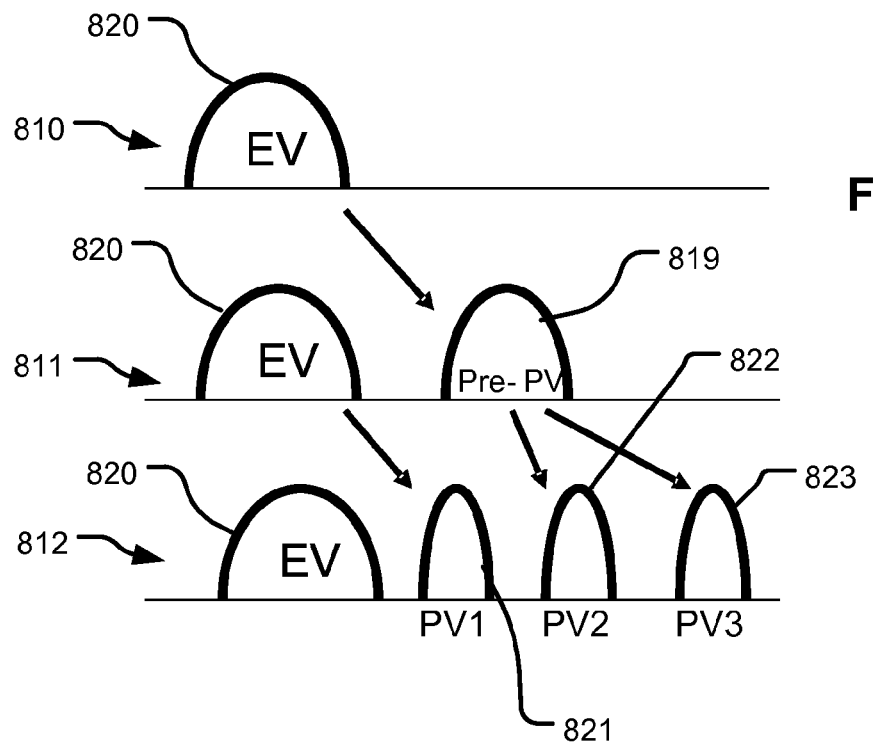
FIG. 25 is a chart illustrating a two phase programming procedure, including a first single pass single verify level in the first phase, and a one-pass, multiple verify level sequence in the second phase.

A first two phase variant using the one-pass, multiple level operation, can be understood with reference to FIG. 25. FIG. 25 shows a first line 810 for the erase pass setting a block of cells to be programmed to the erase state range 820. A second line 811 for a first phase program pass, is shown for moving the threshold range of cells targeted for second and third program levels into a preliminary program range 819, while cells targeted for the first program level remain in the erase state range 820. A third line 812 is shown for a second phase one-pass, multiple-level program operation in which the cells are programmed to first, second and third program state ranges 821, 822, 823, while cells not targeted for program remain in the erase state range 820.

Parameters for a two phase program operation like that of FIG. 25 can include:

Partition page into N groups, where for example N can be 1, 2 or 3.

One preliminary pass for each group of layers with program pulse magnitude from Va to Va' using a constant step $\Delta V3$ using a single preliminary program verify level Pre_PV23.

One target pass for each group of layers, using one of the variants discussed above, such as the second variant OTM-2 or third variant OTM-3_1.

Figure 26:
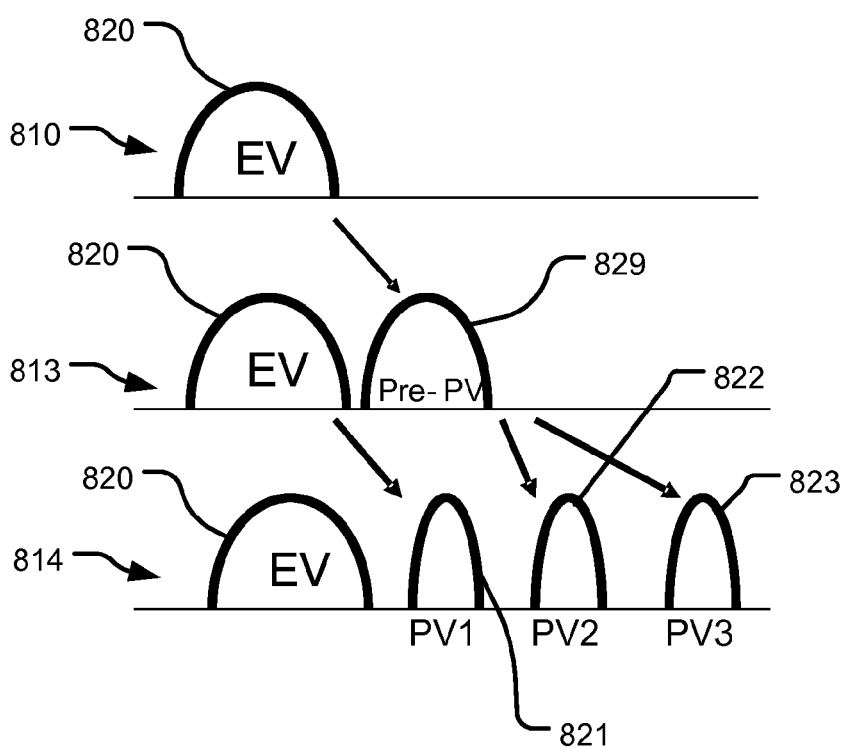
FIG. 26 is a chart of an alternative two phase programming procedure, like that of FIG. 25, where the preliminary program verify level is set to operate for all three target program levels.

A second two phase variant using the one-pass, multiple level operation, can be understood with reference to FIG. 26. FIG. 26 shows a first line 810 for the erase pass setting a block of cells to be programmed to the erase state range 820. A second line 813 for a first phase program pass, is shown for moving the threshold range of cells targeted for first, second and third program levels into a preliminary program range 829. A third line 814 is shown for a second phase one-pass, multiple-level program operation in which the cells are programmed to first, second and third program state ranges 821, 822, 823, while cells not targeted for program remain in the erase state range 820.

Parameters for a two phase program operation like that of FIG. 26 can include:

Partition page into N groups, where for example N can be 1, 2 or 3.

One preliminary pass for each group of layers with program pulse magnitude from Va to Va' using a constant step $\Delta V3$ using a single preliminary program verify level Pre_PV123.

One target pass for each group of layers, using one of the variants discussed above, such as the second variant OTM-2.

Figure 27:
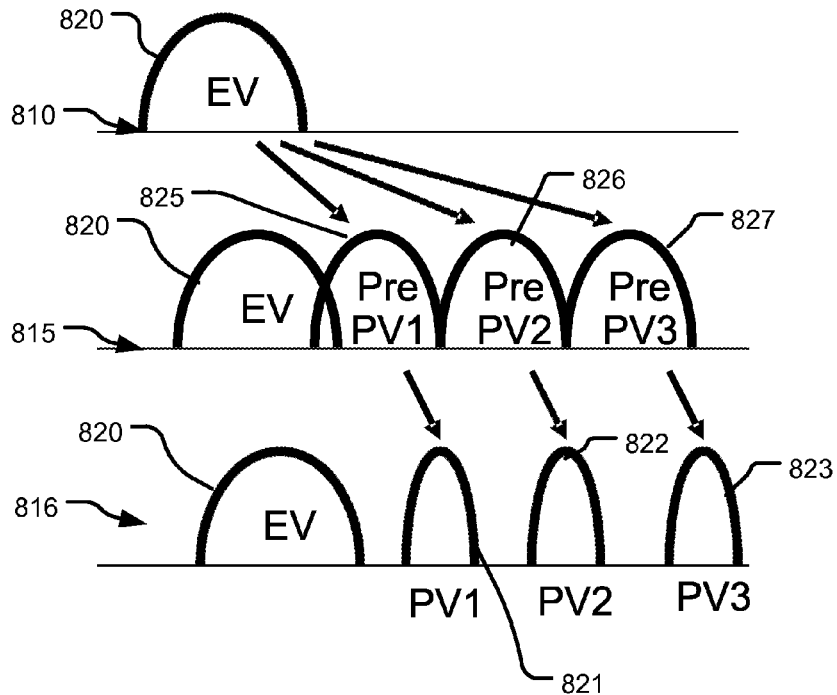
FIG. 27 is a chart of a third two phase programming procedure, in which the first phase includes a one-pass, multiple preliminary program verify level operation, and the second phase includes a one-pass, multiple level programming sequence for target program levels.

A two phase variant using a double one-pass, multiple level operation, can be understood with reference to FIG. 27. FIG. 27 shows a first line 810 for the erase pass setting a block of cells to be programmed to the erase state range 820. A second line 815 for a first phase program pass, is shown for moving the threshold range of cells targeted for a first program level to a first preliminary range 825, cells targeted for a second program level to a second preliminary range 826, and cells targeted for a third program level to a third preliminary range 827. A third line 816 is shown for a second phase one-pass, multiple-level program operation in which the cells are programmed to first, second and third program state ranges 821, 822, 823, while cells not targeted for program remain in the erase state range 820.

Parameters for a two phase program operation like that of FIG. 27 can include:

Partition page into N groups, where for example N can be 1, 2 or 3.

One preliminary pass for each group of layers with program pulse magnitude from Vaa to Vcc' using a constant step $\Delta V3$ using a preliminary program verify levels Pre_PV1, Pre_PV2 and Pre_PV3.

One target pass for each group of layers, using one of the variants discussed above, such as the second variant OTM-1, OTM-2, OTM-3_1 or OTM-3_2. The preliminary pass in the double, one-pass, multiple-level variants can apply operations like any of the variants discussed above, including double OTM-1, double OTM-2, OTM-1 and OTM-3_1, and so one.

Figure 28:
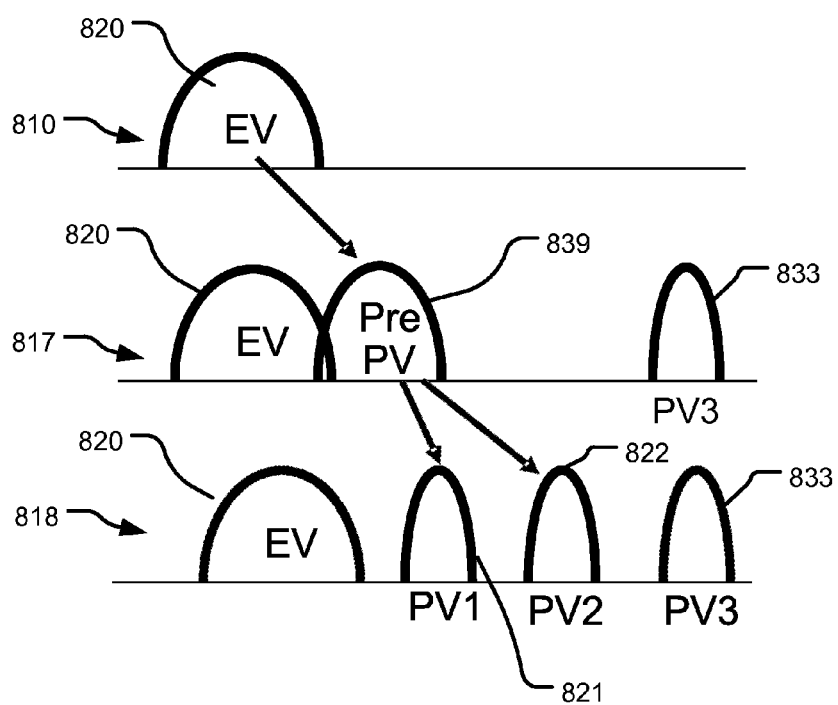
FIG. 28 is a chart of yet another two phase programming procedure, in which a first phase includes one-pass, multiple level programming, where one of the levels is a preliminary program verify level set for the first program level and second program level, while the second verify level is set for the high threshold target program level, and the second phase involves a one-pass, multiple level programming operation, with program verify for the first program level and second program level.

Another two phase variant using a double, one-pass, multiple level operation, can be understood with reference to FIG. 28. FIG. 28 shows a first line 810 for the erase pass setting a block of cells to be programmed to the erase state range 820. A second line 817 for a first phase program pass, is shown for moving the threshold range of cells targeted for a first program level and a second program level to a first preliminary range 839 using first pre-program verify levels, and cells targeted for a third program level to a final third program level range 833 using a pre-program verify level that is set to verify the final program level target of a highest threshold program state. A third line 818 is shown for a second phase one-pass, multiple-level program operation in which the cells are programmed from the preliminary range 839 to first and second program state ranges 821 and 822, while cells targeted for the third program state range 833 are not, or need not be, programmed, and cells not targeted for program remain in the erase state range 820.

Parameters for a two phase program operation like that of FIG. 28 can include:

Partition page into N groups, where for example N can be 1, 2 or 3.

One preliminary pass for each group of layers with program pulse magnitude from Vaa to Vc' using a constant step $\Delta V3$ for pulses in the range Vaa to Vaa' and constant step $\Delta V2$ for pulses in the range from Vaa' to Vc', while using a preliminary program verify levels Pre_PV12 for cells targeted for program levels one and two while the pulses are in the range Vaa to Vaa', and using final program verify level PV3 for cells targeted for the third program level while the pulses are in the range Vc to Vc'.

One target pass applying PV1 verify with program pulse magnitude from Va to Va', with step $\Delta V$, and PV2 verify with program pulse magnitude from Vb to Vb', with step $\Delta V$ to program the cells targeted for the first and second program levels in the ranges 821 and 822. Pass voltages on unselected word lines vary dynamically from $Vpass_{low}$ to $Vpass_{high}$.

Figure 29:
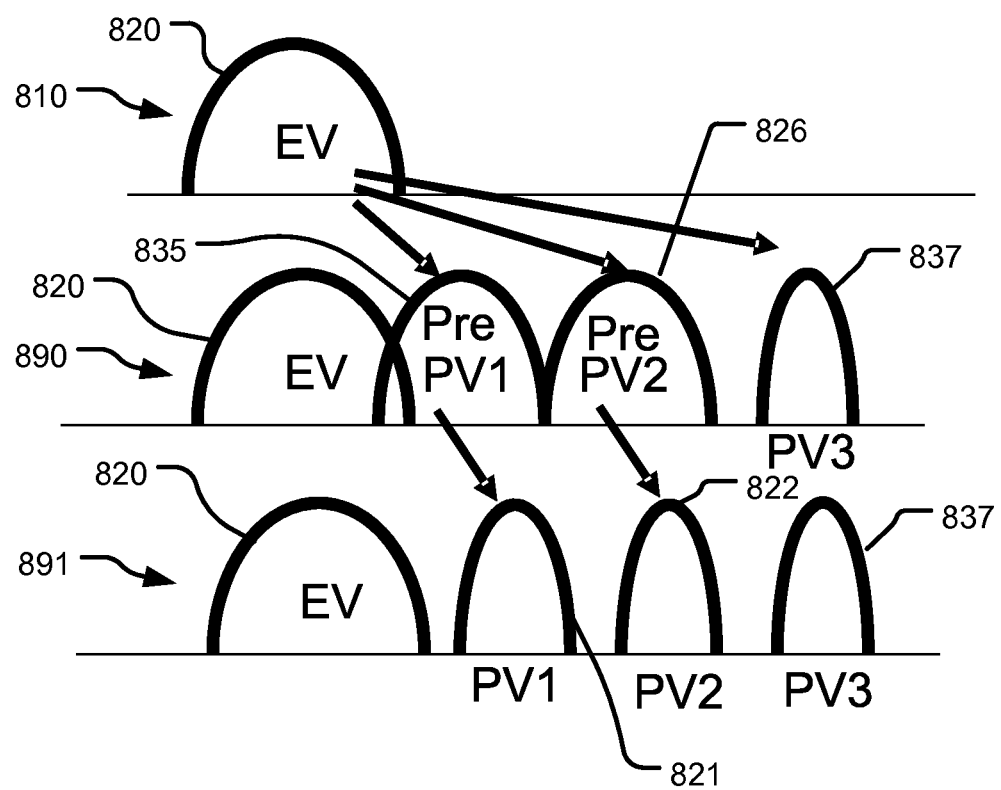
FIG. 29 is a chart of another two phase programming procedure, like that of FIG. 28, except that to preliminary verify levels are utilized in the first pass.

Yet another two phase variant using a double, one-pass, multiple level operation, can be understood with reference to FIG. 29. FIG. 29 shows a first line 810 for the erase pass setting a block of cells to be programmed to the erase state range 820. A second line 890 for a first phase program pass, is shown for moving the threshold range of cells targeted for a first program level and a second program level to a first preliminary range 835 and a second preliminary range 826 using a pre-program verify levels that are set to verify the respective pre-program target levels, and cells targeted for a third program level to a final third program level range 837 using a pre-program verify level that is set to verify the final program level target of a highest threshold program state. A third line 818 is shown for a second phase one-pass, multiple-level program operation in which the cells are programmed from the preliminary ranges 835 and 836 to the first and second program state ranges 821 and 822, while cells targeted for the third program state range 837 are not, or need not be, programmed, and cells not targeted for program remain in the erase state range 820.

Parameters for a two phase program operation like that of FIG. 29 can include:

Partition page into N groups, where for example N can be 1, 2 or 3.

One preliminary pass for each group of layers with program pulse magnitude from Vaa to Vc' using a constant step $\Delta V3$ for pulses in the range Vaa to Vaa' and constant step $\Delta V2$ for pulses in the range from Vaa' to Vc', while using a preliminary program verify level Pre_PV1 for cells targeted for program level one while the pulses are in the range Vaa to Vaa', a preliminary program verify level Pre_PV2 for cells targeted for program level two while the pulses are in the range Vbb to Vbb' and using final program verify level PV3 for cells targeted for the third program level while the pulses are in the range Vc to Vc'.

One target pass applying PV1 verify with program pulse magnitude from Va to Va', with step $\Delta V$, and PV2 verify with program pulse magnitude from Vb to Vb', with step $\Delta V$ to program the cells targeted for the first and second program levels in the ranges 821 and 822. Pass voltages on unselected word lines vary dynamically from $Vpass_{low}$ to $Vpass_{high}$.

Figure 30:
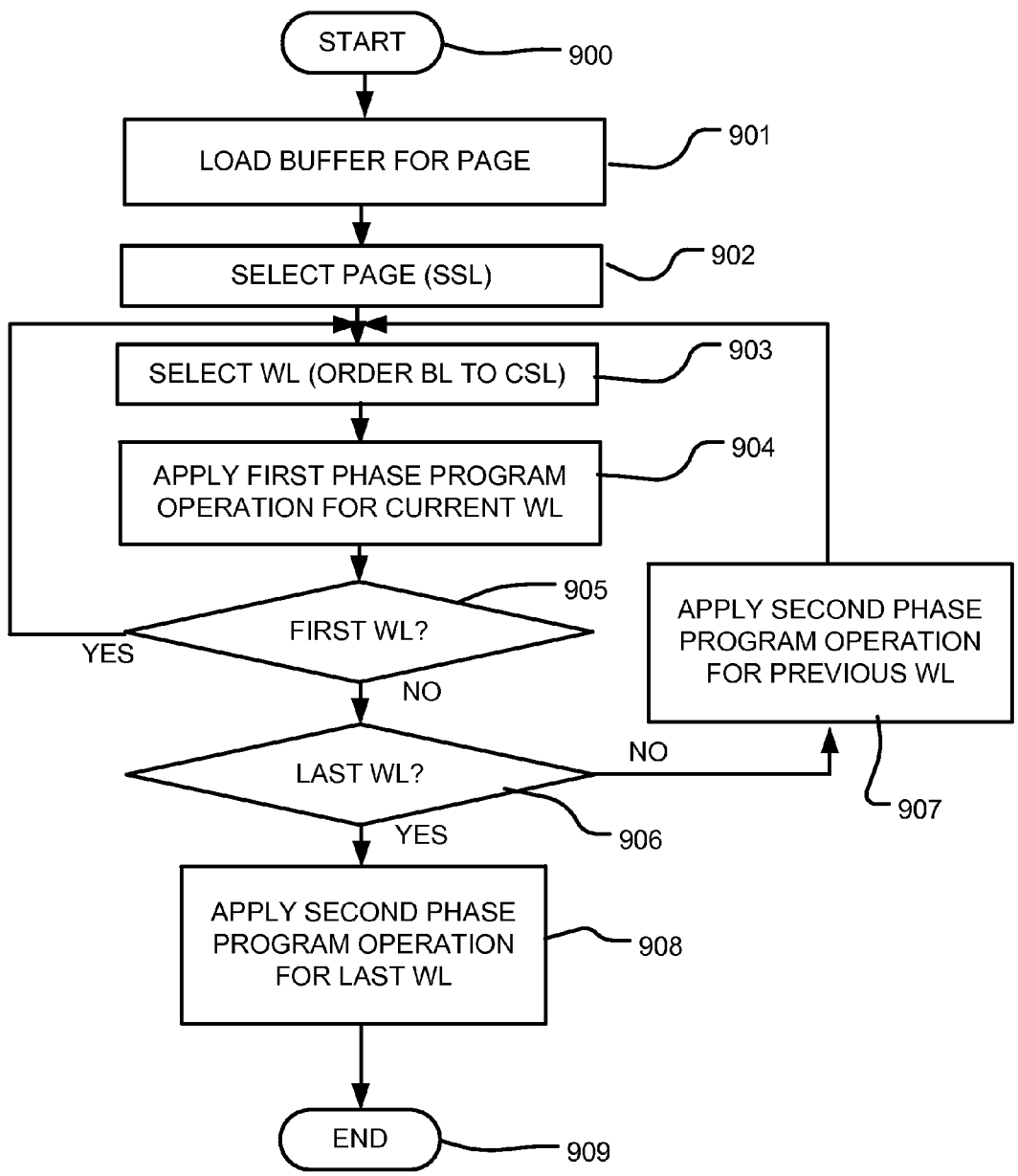
FIG. 30 is a flowchart of a procedure which can be used to apply to face programming, in which at least one phase can be a one-pass, multiple level programming procedure.

FIG. 30 illustrates a procedure for a two phase program operation in which at least one of the first and second phases is a one-pass, multiple-level program operation. When applying a two phase program operation, the controller must hold the data to be programmed for both phases. Thus, if the first phase is executed over a full 8K block, and then the second phase is executed over the 8K block, then the buffer used by the controller must be very large, holding data for 8K cells for each block in a row, for use in the two phases. The procedure shown in FIG. 30 can be applied to reduce the size needed for the buffer, assuming sixteen pages per block, to data for two sets of 512 cells for each block in a row. In the process of FIG. 30, the procedure starts at block 900. A buffer for the data to be programmed in a page is loaded (901). Then a page is selected in each block in a row, by setting the appropriate SSL switch in a memory like that of FIG. 2 (902). The procedure follows a "by-page" programming sequence, starting with selecting a first word line, and proceeding in order from the bit line or SSL end to the source line, or GSL end (903). A first phase program operation is applied to the current word line 904). The procedure determines whether the current word line is the first word line in the order (905). If so, then it loops to select the next word line at block 903. If it is not the first word line, then the procedure determines whether the current word line is the last word line in the order (906). If it is not the last word line in the order, then the second phase program operation is applied on the previous word line to which the first phase has already been applied (907). If at step 906, it is the last word line, then the second phase program operation is applied on the last word line (908). The two phase program procedure then ends for the selected page (909).

The first phase program operation applied at block 904 in FIG. 30 can be one of the examples explained above, including a one-pass, one preliminary level operation, or a one-pass, multiple preliminary levels operation, or a one-pass operation with a combination of preliminary and target level operations. Likewise the second phase program operation applied in blocks 907 and 908 in FIG. 30 can be one of the examples explained above, including a variant of one-pass, multiple level operations set at target program verify levels.

The example in FIG. 30 is a "by-page" cycle as discussed above, which can reduce disturb in some memory configurations. The procedure can be executed using a "by-word line" procedure as well, to reduce the necessary size of the buffer used by the controller relative to by block operations. However, because of the number of pages on a word line can be greater than the number of word lines on a page, the buffer size may be less if "by-page" programming is used.

One-pass, multiple-level programming procedures have been described herein with reference to incremental step pulsed programming ISPP, in which the bit lines are biased for inhibit or program, while word line voltages are increased by voltage steps for each program pulse. In other embodiments, one-pass, multiple-level programming procedures, can involve program cycles in which program pulses that cause steps in program levels of the target memory cells using bias arrangements of other types. For example, word line voltage pulse levels can be maintained constant, while bit line program bias levels are varied from cycle to cycle. Other variations of the program pulse bias configuration can be implemented as suits a particular memory architecture, and memory cell type.

A memory device is described therefore, including one-pass, multiple-level programming operations as described herein can significantly reduce program pulse counts in a programming operation for high density multiple-level memory. Program disturb and pass voltage disturb are also reduced. Furthermore, program throughput is improved.

In multiple-level cell operation, a verify function is required for each programming pulse in the pulse sequence, at each program level to be established for multibit storage. For a two bit cell, three verify functions are required. For a three bit cell, seven verify functions are required. In variations of the one pass, multiple-level programming procedures, the number of verify functions required for early pulses in the sequence can be reduced by eliminating a high threshold verify steps, and can be reduced in the late pulses of the sequence by limiting the low threshold verify steps.

Programming results can be improved significantly over multipass, single verify per pass operations of the prior art. Variations of one-pass, multi-level programming can be implemented as required for particular memory architectures to programming results.

One pass, multiple-level programming can also be adapted into phase programming sequences that reduce interference that can disturb program levels in neighboring cells.

Dynamic pass voltages which are adjusted according to the program pulse being applied, can be utilized along with one-pass, multiple-level programming sequences.

The one-pass, multiple-level programming sequence can be utilized into phase programming operations that minimize interference in fact pattern effects.

Embodiments of the programming operations have been described with reference to this architecture of FIG. 2. The operations can be tuned for a variety of 3-D memory architectures, and to date memory architectures.

Also, embodiments of the programming operations have been described with reference to flash memory. The operations can be tuned for other memory cell types as well.

While the present invention is disclosed by reference to the preferred embodiments and examples detailed above, it is understood that these examples are intended in an illustrative rather than in a limiting sense. It is contemplated that modifications and combinations will readily occur to those skilled in the art, which modifications and combinations will be within the spirit of the invention and the scope of the following claims.

The invention claimed is:

1. A method of operating a multiple bits per cell memory, comprising:
   storing a data set for programming a plurality of multi-level memory cells, the data set including for multi-level memory cells in the plurality of multi-level memory cells corresponding multi-bit codes indicating one of a plurality of program states or an inhibit state, where the plurality of program states correspond to a corresponding plurality of program level targets for the multi-level memory cells; and
   executing a plurality of program cycles for the plurality of multi-level memory cells to program the plurality of multi-level memory cells to program states in the plurality of program states, wherein a program cycle in the plurality of program cycles includes:
   (i) applying a program bias to a set of multi-level memory cells in the plurality of multi-level memory cells for which the corresponding multi-bit codes indicate one of the plurality of program states, and
   (ii) after applying the program bias, applying program verify steps to the set of multi-level memory cells, including a program verify step for each multi-level memory cell in the set applying one or more program level targets determined by the corresponding multi-bit codes and updating the corresponding multi-bit codes in the data set based upon program level targets at which the multi-level memory cells pass,
   wherein the plurality of multi-level memory cells are configured in a plurality of stacked layers, including grouping multi-level memory cells into a plurality of groups, where a first group of memory cells includes a first set of layers and a second group of memory cells includes a second set of layers;
   wherein the memory includes a plurality of pages of memory cells, and a page includes memory cells coupled to a set of N bit lines and to a set of M word lines, the plurality of multi-level memory cells includes memory cells in a selected page coupled in common to one word line, and the multi-level memory cells in respective stacked layers in the plurality of stacked layers are connected to bit lines in the set of N bit lines; and
   including programming a page of memory cells by performing said storing and said executing for successive pluralities of multi-level memory cells, in an order that includes selecting the page, selecting memory cells in the selected page in the first group, and then selecting in sequence each word line in the page, and then selecting memory cells in the selected page in the second group, and then selecting in sequence each word line in the page.

2. The method of claim 1, wherein the multi-level memory cells comprise charge trapping memory cells, and the program level targets are threshold voltage levels.

3. The method of claim 1, wherein executing the plurality of program cycles includes a sequence of program cycles which incrementally increase program levels of the multi-level memory cells in the plurality of program states.

4. The method of claim 1, wherein executing the plurality of program cycles includes at least one program cycle that includes applying only one program verify step for one of the plurality of program level targets.

5. The method of claim 1, wherein executing the plurality of program cycles includes at least one program cycle that includes applying multiple program verify steps, including a program verify step for each one of the plurality of program level targets.

6. The method of claim 1, including changing the program bias during the plurality of cycles.

7. The method of claim 1, wherein the program bias applied in the program cycle includes a word line voltage applied to a word line coupled in common to the plurality of multi-level memory cells, and a selected one of program enable bias and a program inhibit bias applied to bit lines coupled to the plurality of memory cells.

8. The method of claim 1, including using a preliminary programming sequence before applying the plurality of program cycles.

9. The method of claim 8, wherein the preliminary programming sequence includes one or more preliminary program cycles, wherein a preliminary program cycle includes applying a preliminary program bias to multi-level memory cells in the plurality of program states, and after applying the preliminary program bias, applying one or more pre-program verify steps at a preliminary program level or preliminary program levels.

10. The method of claim 8, wherein the preliminary programming sequence includes executing a plurality of preliminary program cycles including at least one preliminary program cycle that includes applying a preliminary program bias to multi-level memory cells in one of the plurality of program states, and after applying the preliminary program bias applying multiple program verify steps, including a pre-program verify step for each one of a plurality of preliminary program levels.

11. The method of claim 10, wherein the pre-program verify step for each one of the plurality of program levels includes applying a different pre-program verify voltage for each one of the plurality of preliminary program levels.

12. The method of claim 10, wherein the pre-program verify step for each one of the plurality of program levels includes applying a first pre-program verify voltage for one or more of plurality of preliminary program levels, and a second pre-program verify voltage for one of plurality of preliminary program levels having a highest target threshold, and wherein the second pre-program verify voltage is set to verify the program level target of a highest threshold program state.

13. The method of claim 1, wherein the memory includes a plurality of pages of memory cells, and a page includes memory cells coupled to a set of N bit lines and to a set of M word lines, and the plurality of multi-level memory cells includes memory cells in a selected page coupled in common to one word line.

14. The method of claim 13, including programming the page of memory cells in an order that includes selecting the page, and then selecting in sequence each word line in the page.

15. The method of claim 14, wherein the memory comprises strings of memory cells each string coupled on one end to one of the N bit lines by a first select switch and coupled to a source of reference voltage on another end by a second switch, and the step of selecting in sequence each word line in the page includes starting with a memory cell on the string nearest to the first switch and proceeding in order down the string to the memory cell on the string nearest to the second switch.

16. The method of claim 1, wherein the plurality of groups includes at least three groups, and the bit lines in each group are separated by at least two other bit lines in two different groups of layers.

17. A method of operating a multiple bits per cell memory, comprising:
 storing a data set for programming a plurality of multi-level memory cells, the data set including multi-bit codes indicating one of a plurality of program states or an inhibit state for corresponding multi-level memory cells in the plurality of multi-level memory cells, where the plurality of program states correspond to a corresponding plurality of program level targets for the multi-level memory cells; and
 executing a plurality of program cycles for the plurality of multi-level memory cells to program the plurality of multi-level memory cells to program level targets in the plurality of program level targets indicated by initial values of the multi-bit codes, wherein a program cycle in the plurality of program cycles includes:
  (i) applying a program bias to multi-level memory cells in the plurality of multi-level memory cells for which the multi-bit codes indicate one of the plurality of program states, and
  (ii) after applying the program bias, applying program verify steps for more than one of the plurality of program level targets and updating the multi-bit codes in the data set based upon program level targets at which the corresponding multi-level memory cells pass verification during the program verify steps,
 wherein the plurality of multi-level memory cells are configured in a plurality of stacked layers, including grouping multi-level memory cells into a plurality of groups, where a first group of memory cells includes a first set of layers and a second group of memory cells includes a second set of layers; and
 wherein executing the plurality of program cycles includes a first sequence of program cycles applied to store data in multi-level memory cells in the first group, while memory cells in the second group are in the inhibit state, and a second sequence of program cycles applied to store data in multi-level memory cells in the second group, while memory cells in the first group are in the inhibit state,
 wherein the plurality of groups includes at least three groups, and bit lines coupled to multi-level memory cells in each group are separated by at least two other bit lines in two different groups of layers.

* * * * *